US010468523B2

(12) United States Patent
Fujii et al.

(10) Patent No.: US 10,468,523 B2
(45) Date of Patent: Nov. 5, 2019

(54) SEMICONDUCTOR DEVICE AND METHOD FOR MANUFACTURING THE SAME

(71) Applicant: RENESAS ELECTRONICS CORPORATION, Tokyo (JP)

(72) Inventors: Hiroki Fujii, Ibaraki (JP); Takahiro Mori, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/847,342

(22) Filed: Dec. 19, 2017

(65) Prior Publication Data

US 2018/0175192 A1 Jun. 21, 2018

(30) Foreign Application Priority Data

Dec. 20, 2016 (JP) .................................. 2016-246521

(51) Int. Cl.
*H01L 29/66* (2006.01)
*H01L 29/78* (2006.01)
(Continued)

(52) U.S. Cl.
CPC .... *H01L 29/7816* (2013.01); *H01L 21/76224* (2013.01); *H01L 29/063* (2013.01); *H01L 29/0607* (2013.01); *H01L 29/0649* (2013.01); *H01L 29/0653* (2013.01); *H01L 29/0847* (2013.01); *H01L 29/0865* (2013.01); *H01L 29/0882* (2013.01); *H01L 29/1095* (2013.01); *H01L 29/4236* (2013.01); *H01L 29/42368* (2013.01); *H01L 29/66659* (2013.01); *H01L 29/66681* (2013.01); *H01L 29/7835* (2013.01);
(Continued)

(58) Field of Classification Search
CPC ............. H01L 29/7816; H01L 29/0653; H01L 29/063; H01L 29/0865; H01L 29/0649; H01L 29/0607; H01L 29/66681; H01L 29/1095; H01L 29/0882; H01L 29/1083; H01L 29/4236; H01L 29/42368; H01L 29/66659; H01L 29/7835; H01L 29/0847
See application file for complete search history.

(56) References Cited

U.S. PATENT DOCUMENTS

2009/0283825 A1 11/2009 Wang et al.
2015/0243777 A1* 8/2015 Fujii ................... H01L 29/7816
257/337

FOREIGN PATENT DOCUMENTS

JP 2009-278100 A 11/2009
JP 2015-162581 A 9/2015

OTHER PUBLICATIONS

H. Fujii et al., "A Recessed Gate LDMOSFET for Alleviating HCI Effects", Proceedings of the 2016 28th ISPSD, Jun. 12-16, 2016, Prague, Czech Republic, pp. 167-170.

* cited by examiner

*Primary Examiner* — Didarul A Mazumder
*Assistant Examiner* — Wasiul Haider
(74) *Attorney, Agent, or Firm* — McDermott Will & Emery LLP

(57) ABSTRACT

A recessed portion is formed in a top surface of an isolation insulation film filling an isolation trench between a p⁺ source region and a p⁺ drain region. A p⁻ drift region is located below the isolation trench and connected to the p⁺ drain region. A gate electrode fills the recessed portion. An n-type impurity region is located below the p⁻ drift region and directly below the recessed portion.

10 Claims, 19 Drawing Sheets

(51) Int. Cl.
H01L 29/06 (2006.01)
H01L 29/08 (2006.01)
H01L 29/10 (2006.01)
H01L 21/762 (2006.01)
H01L 29/423 (2006.01)
H01L 21/3105 (2006.01)
H01L 27/092 (2006.01)
H01L 27/06 (2006.01)
H01L 21/8238 (2006.01)

(52) U.S. Cl.
CPC ............ *H01L 21/31053* (2013.01); *H01L 21/823814* (2013.01); *H01L 27/0623* (2013.01); *H01L 27/092* (2013.01); *H01L 29/1083* (2013.01)

・COMPARATIVE EXAMPLE

·EMBODIMENT

SEMICONDUCTOR DEVICE AND METHOD FOR MANUFACTURING THE SAME

This nonprovisional application is based on Japanese Patent Application No. 2016-246521 filed on Dec. 20, 2016 with the Japan Patent Office, the entire contents of which are hereby incorporated by reference.

BACKGROUND OF THE INVENTION

Field of the Invention

The present invention relates to a semiconductor device and a method for manufacturing the same.

Description of the Background Art

Use of an STI (Shallow Trench Isolation) structure between a gate and a drain of a high-breakdown-voltage LDMOS (Laterally Diffused Metal Oxide Semiconductor) transistor in order to achieve a higher breakdown voltage is known. Such a structure is disclosed in, for example, Japanese Patent Laying-Open No. 2015-162581, Japanese Patent Laying-Open No. 2009-278100 and the like.

The above-mentioned two publications disclose a configuration in which a trench is formed in a top surface of an isolation insulation film filling an isolation trench and a part of a gate electrode fills the trench.

According to the configuration described in the above-mentioned two publications, the phenomenon called "hot carrier injection (HCI)" can be improved. "Hot carrier injection" herein refers to a phenomenon in which carriers (hot carriers) accelerated by a drain electric field of an LDMOS transistor to have high energy are injected into a gate insulation film, which causes fluctuations in properties (Ids and Vth) of the transistor.

SUMMARY OF THE INVENTION

However, the technique described in the above-mentioned two publications may be insufficient in terms of the effect of suppressing injection of the hot carriers into the gate insulation film.

The other problems and new features will become apparent from the description of the present specification and the accompanying drawings.

According to a semiconductor device in one embodiment, a recessed portion is formed in a top surface of an isolation insulation film filling an isolation trench between a source region of a first conductivity type and a drain region of the first conductivity type. A drift region of the first conductivity type is located below the isolation trench and connected to the drain region. A gate electrode fills the recessed portion. A first impurity region of a second conductivity type is located below the drift region and directly below the recessed portion.

According to a method for manufacturing a semiconductor device in one embodiment, an isolation insulation film filling an isolation trench and having a recessed portion in a top surface is formed. A first impurity region of a second conductivity type located below a drift region and directly below the recessed portion is formed. A gate electrode facing a main surface sandwiched between a source region and the drift region with a gate insulation film interposed therebetween, and filling the recessed portion is formed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments will be described hereinafter with reference to the drawings.

First Embodiment

Figure 1:
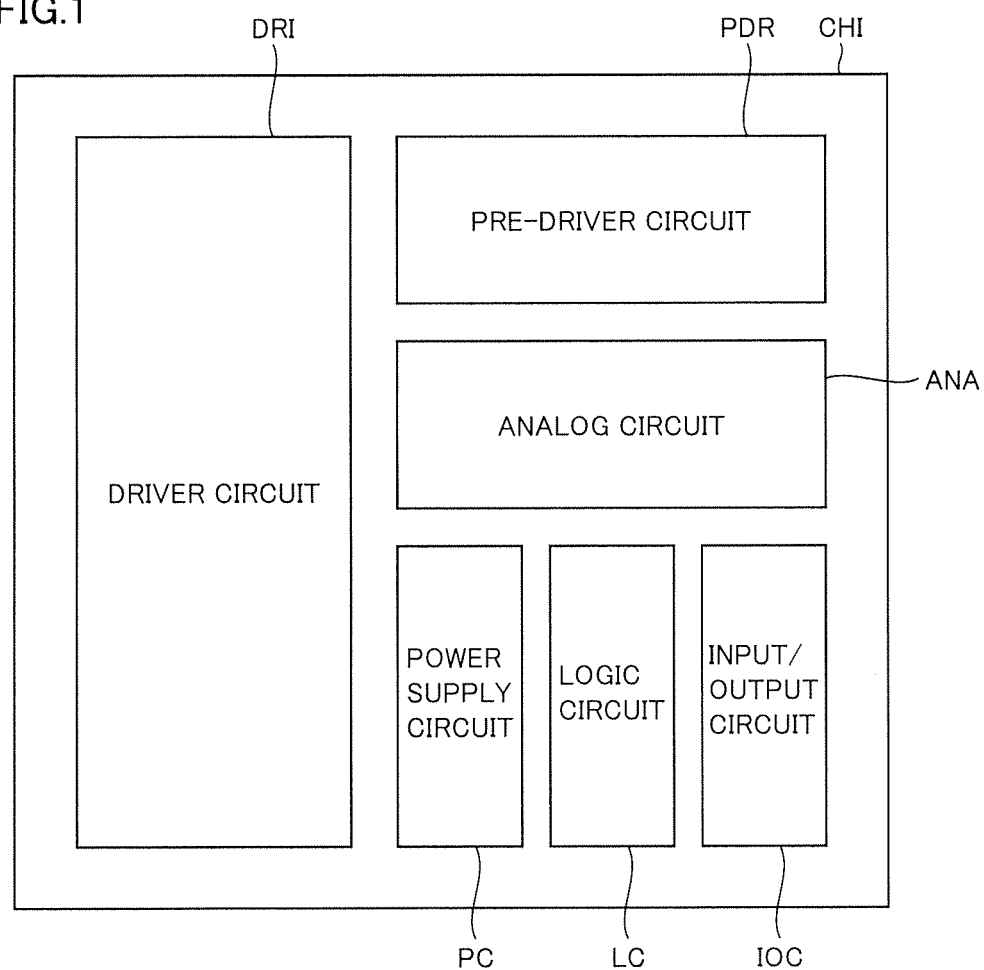
FIG. 1 is a plan view schematically showing a configuration of a semiconductor device in a chip state according to a first embodiment.

As shown in FIG. 1, a semiconductor device CH according to the present embodiment is, for example, in a chip state and has a semiconductor substrate. The regions for forming a driver circuit DRI, a pre-driver circuit PDR, an analog circuit ANA, a power supply circuit PC, a logic circuit LC, an input/output circuit IOC and the like are arranged on a surface of the semiconductor substrate.

The semiconductor device according to the present embodiment is not limited to a semiconductor chip, and may be in a wafer state or may be in a package state sealed with a sealing resin.

Figure 2:
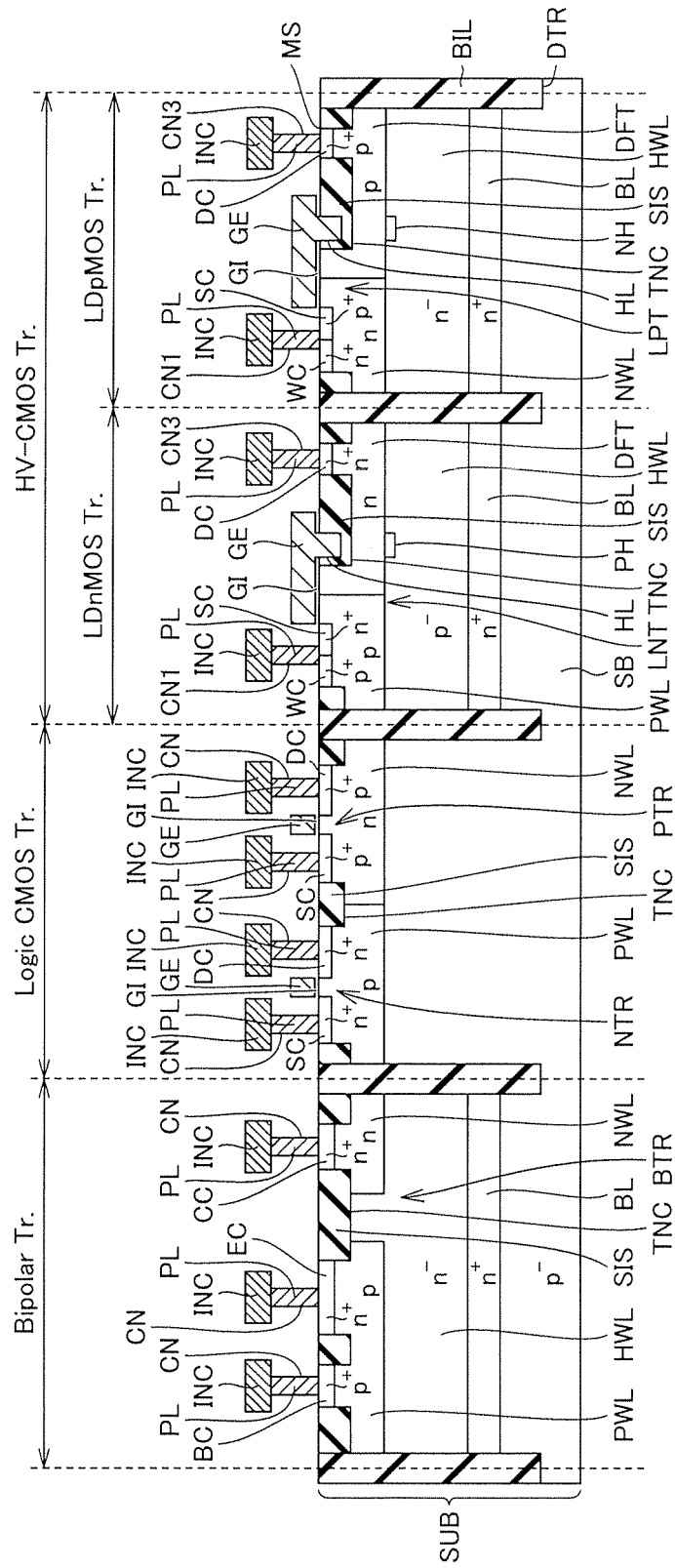
FIG. 2 is a cross-sectional view showing the configuration of the semiconductor device shown in FIG. 1.

As shown in FIG. 2, the semiconductor device according to the present embodiment includes a high-breakdown-voltage CMOS (Complementary Metal Oxide Semiconductor) transistor, a logic CMOS transistor and a bipolar transistor.

The high-breakdown-voltage CMOS transistor has an n channel-type LD (Laterally Diffused) MOS transistor LNT and a p channel-type LDMOS transistor LPT. The logic CMOS transistor has an n channel-type MOS transistor NTR and a p channel-type MOS transistor PTR.

In the following description, the n channel-type LDMOS transistor is denoted as "nLDMOS transistor" and the p channel-type LDMOS transistor is denoted as "pLDMOS transistor". In addition, the n channel-type MOS transistor is denoted as "nMOS transistor" and the p channel-type MOS transistor is denoted as "pMOS transistor".

The transistors are formed on a main surface MS of a semiconductor substrate SUB. The regions for forming the transistors are electrically isolated by a DTI (Deep Trench Isolation). The DTI has a trench DTR formed in main surface MS of semiconductor substrate SUB, and an insulation film BIL filling trench DTR.

In the region for forming the logic CMOS transistor, a p-type well region PWL and an n-type well region NWL are arranged side by side on a substrate region SB of semiconductor substrate SUB. nMOS transistor NTR is arranged in p-type well region PWL and pMOS transistor PTR is arranged in n-type well region NWL.

The region for forming nMOS transistor NTR and the region for forming pMOS transistor PTR are electrically isolated by an STI (Shallow Trench Isolation). The STI has an isolation trench TNC formed in main surface MS of semiconductor substrate SUB, and an isolation insulation film SIS filling isolation trench TNC.

Isolation trench TNC of the STI is arranged to be shallower from main surface MS than trench DTR of the DTI. Isolation trench TNC of the STI is arranged to be shallower than p-type well region PWL and n-type well region NWL.

nMOS transistor NTR described above has an $n^+$ source region SC, an $n^+$ drain region DC, a gate insulation film GI, and a gate electrode GE. $N^+$ source region SC and $n^+$ drain region DC are spaced apart from each other and arranged in main surface MS of semiconductor substrate SUB. Gate electrode GE is arranged on main surface MS of semiconductor substrate SUB sandwiched between $n^+$ source region SC and $n^+$ drain region DC, with gate insulation film GI interposed therebetween.

pMOS transistor PTR described above has a $p^+$ source region SC, a $p^+$ drain region DC, gate insulation film GI, and gate electrode GE. $P^+$ source region SC and $p^+$ drain region DC are spaced apart from each other and arranged in main surface MS of semiconductor substrate SUB. Gate electrode GE is arranged on main surface MS of semiconductor substrate SUB sandwiched between $p^+$ source region SC and $p^+$ drain region DC, with gate insulation film GI interposed therebetween.

In the region for arranging the bipolar transistor, an $n^+$ buried region BL is arranged on substrate region SB of semiconductor substrate SUB. An $n^-$ well region HWL is arranged on $n^+$ buried region BL. P-type well region PWL and n-type well region NWL are arranged on $n^-$ well region HWL. P-type well region PWL and n-type well region NWL are adjacent to each other with a part of $n^-$ well region HWL interposed therebetween.

A $p^+$ base region BC and an $n^+$ emitter region EC are arranged in p-type well region PWL. An $n^+$ collector region CC is arranged in n-type well region NWL. $P^+$ base region BC, $n^+$ emitter region EC and $n^+$ collector region CC form a bipolar transistor BTR.

The STIs are arranged between p+ base region BC and n+ emitter region EC and between n+ emitter region EC and n+ collector region CC. As a result, p+ base region BC, n+ emitter region EC and n+ collector region CC are electrically isolated from one another.

An interconnection layer INC is electrically connected to each impurity region (n+ source region SC, n+ drain region DC, p+ base region BC, n+ emitter region EC, and n+ collector region CC).

Specifically, an interlayer insulation film (not shown) is arranged so as to cover main surface MS of semiconductor substrate SUB. A contact hole CN reaching each impurity region is arranged in this interlayer insulation film. A plug conductive layer PL fills contact hole CN. Interconnection layer INC is arranged on the interlayer insulation film so as to be in contact with plug conductive layer PL. As a result, interconnection layer INC is electrically connected to each impurity region with plug conductive layer PL interposed therebetween.

The pLDMOS transistor of the high-breakdown-voltage CMOS transistor will be described below with reference to FIGS. 3 and 4.

Figure 3:
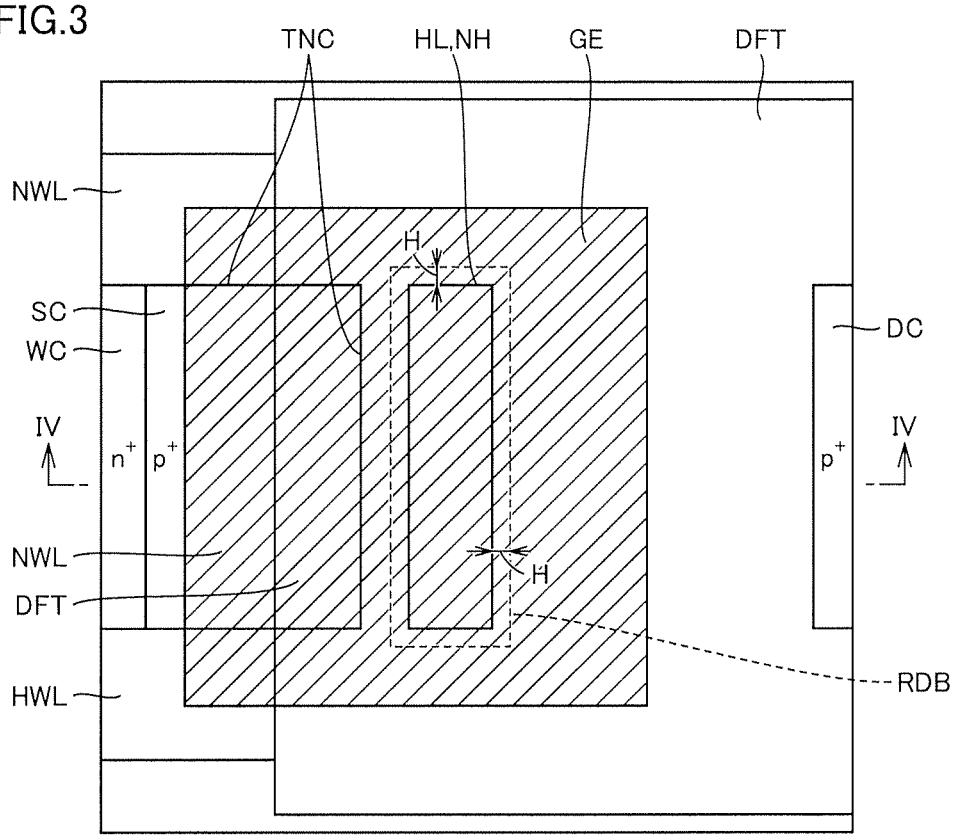
FIG. 3 is a plan view showing a configuration of an LDpMOS transistor portion shown in FIG. 2.
Figure 4:
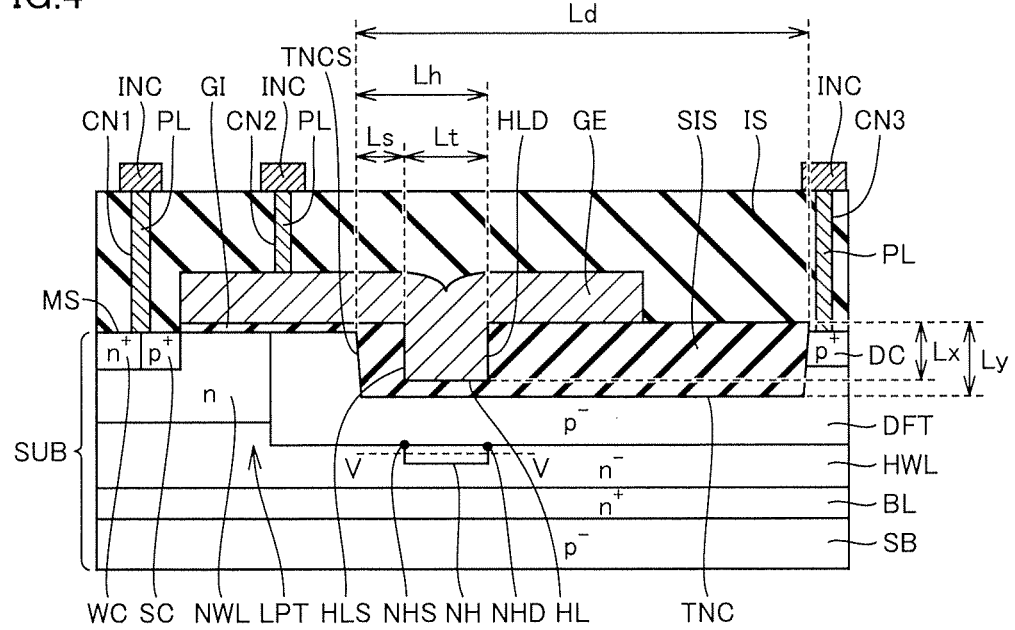
FIG. 4 is a schematic cross-sectional view taken along line IV-IV in FIG. 3.

As shown in FIGS. 3 and 4, in the region for arranging the pLDMOS transistor, n+ buried region BL is arranged on substrate region SB of semiconductor substrate SUB. N− well region HWL (first well region) is arranged on n+ buried region BL. A p− drift region DFT and n-type well region NWL (second well region) are arranged on n− well region HWL. N− well region HWL has an n-type impurity concentration lower than that of n-type well region NWL.

P− drift region DFT and n-type well region NWL are adjacent to each other to form a pn junction. The pn junction formed by p− drift region DFT and n-type well region NWL extends from main surface MS of semiconductor substrate SUB along a depth direction.

The STI is arranged in main surface MS of semiconductor substrate SUB. This STI has isolation trench TNC and isolation insulation film SIS. Isolation trench TNC is arranged in p− drift region DFT. In other words, p− drift region DFT surrounds isolation trench TNC and is located below isolation trench TNC. Isolation insulation film SIS fills isolation trench TNC. A recessed portion HL is arranged in a top surface of isolation insulation film SIS. A bottom surface of recessed portion HL is located inside isolation insulation film SIS. In other words, the bottom portion of recessed portion HL does not reach p− drift region DFT.

P+ source region SC and an n+ contact region WC are arranged in main surface MS inside n-type well region NWL. P+ source region SC and n+ contact region WC are adjacent to each other. P+ source region SC forms a pn junction with each of n-type well region NWL and n+ contact region WC. N+ contact region WC has an n-type impurity concentration higher than that of n-type well region NWL.

P+ drain region DC is arranged in main surface MS inside p− drift region DFT. P+ drain region DC is adjacent to isolation trench TNC. P+ drain region DC has a p-type impurity concentration higher than that of p− drift region DFT. Isolation trench TNC is sandwiched between p+ drain region DC and p+ source region SC.

Gate electrode GE is arranged on main surface MS sandwiched between p+ source region SC and p− drift region DFT, with gate insulation film GI interposed therebetween. Gate electrode GE faces main surface MS sandwiched between p+ source region SC and p− drift region DFT while being insulated from main surface MS sandwiched between p+ source region SC and p− drift region DFT.

Gate electrode GE extends over isolation insulation film SIS of the STI and fills recessed portion HL of isolation insulation film SIS. Gate electrode GE extends further toward the drain region DC side from the portion where gate electrode GE fills recessed portion HL. Gate electrode GE faces each of p− drift region DFT and n− well region HWL with isolation insulation film SIS interposed therebetween.

An n-type impurity region NH (first impurity region) is arranged below p− drift region DFT so as to have a portion located directly below recessed portion HL. Although n-type impurity region NH may be in contact with p− drift region DFT, n-type impurity region NH may not be in contact with p− drift region DFT.

Figure 5:
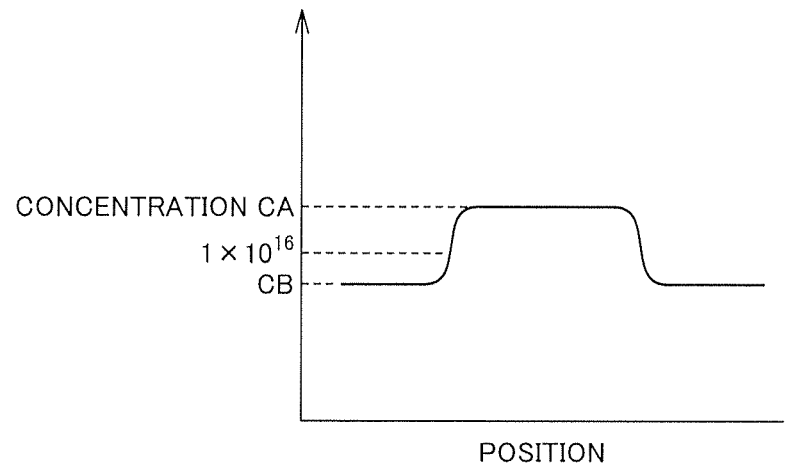
FIG. 5 is a diagram showing an impurity concentration distribution along line V-V in FIG. 4.

As shown in FIG. 5, n-type impurity region NH has an n-type impurity concentration CA of, for example, $1 \times 10^{17}$ cm$^{-3}$ to $6 \times 10^{17}$ cm$^{-3}$. On the other hand, n− well region HWL has an n-type impurity concentration CB of, for example, $5 \times 10^{15}$ cm$^{-3}$. A boundary between n-type impurity region NH and n− well region HWL is a portion having an n-type impurity concentration of, for example, $1 \times 10^{16}$ cm$^{-3}$.

Figure 6:
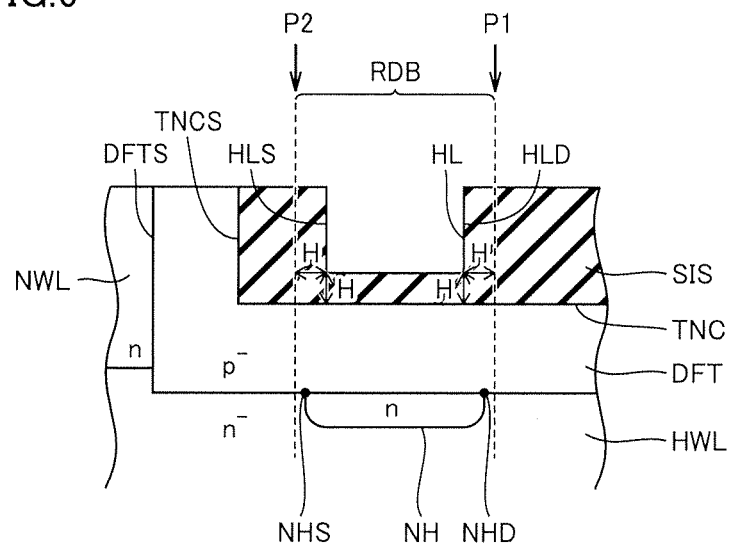
FIG. 6 is an enlarged partial cross-sectional view for illustrating a position of an n-type impurity region below a recess.

As shown in FIG. 6, "directly below recessed portion HL" in this disclosure refers to a region directly below recessed portion HL inside a region RDB (region indicated by a broken line in FIG. 3) formed by enlarging recessed portion HL in a plan view by a dimension H that is the same as a distance H from the bottom surface of recessed portion HL to a bottom surface of isolation trench TNC.

Now, a position closer to drain region DC by above-described dimension H than an end HLD of recessed portion HL on the drain region DC side is denoted as a position P1. Then, an end NHD of n-type impurity region NH on the drain region DC side is located closer to source region SC than position P1.

In addition, a position closer to source region SC by above-described dimension H than an end HLS of recessed portion HL on the source region SC side is denoted as a position P2. Then, an end NHS of n-type impurity region NH on the source region SC side is preferably located closer to drain region DC than position P2.

In addition, n-type impurity region NH is preferably located only directly below recessed portion HL. Specifically, it is preferable that n-type impurity region NH is arranged inside above-described region RDB and does not protrude from region RDB in a plan view. "Plan view" refers to a point of view from a direction orthogonal to main surface MS of semiconductor substrate SUB as shown in FIG. 3, for example.

In addition, end NHS of n-type impurity region NH on the source region SC side is located closer to drain region DC than an end TNCS of isolation trench TNC on the source region SC side. In addition, end NHS of n-type impurity region NH on the source region SC side is located closer to drain region DC than an end DFTS of p− drift region DFT on the source region SC side.

Figure 7:
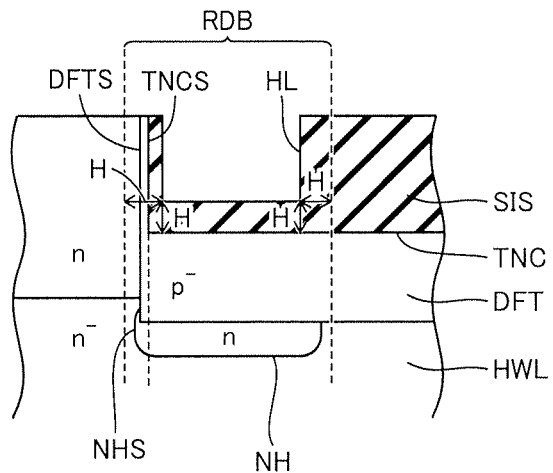
FIG. 7 is an enlarged partial cross-sectional view for illustrating the position of the n-type impurity region below the recess.

However, as shown in FIG. 7, end NHS of n-type impurity region NH on the source side may be located closer to source region SC than end TNCS of isolation trench TNC on the source region SC side. In addition, end NHS of n-type impurity region NH on the source side may be located closer to source region SC than end DFTS of p− drift region DFT on the source region SC side.

As shown in FIG. 4, a length of isolation trench TNC in a direction from source region SC to drain region DC (source-drain direction) is denoted as Ld. Recessed portion HL is located within a dimensional range of one third of above-described length Ld from end TNCS of isolation trench TNC on the source region SC side.

Specifically, a dimension Lh between end HLD of recessed portion HL on the drain region DC side and end TNCS of isolation trench TNC on the source region SC side is not longer than one third of above-described length Ld.

N-type impurity region NH is also located within a dimensional range of one third of length Ld of isolation trench TNC from end TNCS of isolation trench TNC on the source region SC side.

Specifically, a dimension in the above-described source-drain direction between end NHD of n-type impurity region NH on the drain region DC side and end TNCS of isolation trench TNC on the source region SC side is not longer than one third of above-described length Ld.

In addition, a dimension in the above-described source-drain direction between end NHS of n-type impurity region NH on the source region SC side and end TNCS of isolation trench TNC on the source region SC side is not longer than one third of above-described length Ld.

In addition, a dimension Ls between end HLS of recessed portion HL on the source region SC side and end TNCS of isolation trench TNC on the source region SC side is not smaller than a film thickness of gate insulation film GI.

An interlayer insulation film IS is arranged on main surface MS of semiconductor substrate SUB. A plurality of contact holes CN1, CN2 and CN3 are arranged in interlayer insulation film IS. Contact hole CN1 reaches both $p^+$ source region SC and $n^+$ contact region WC. Contact hole CN2 reaches gate electrode GE. Contact hole CN3 reaches $p^+$ drain region DC.

Plug conductive layer PL fills each of contact holes CN1, CN2 and CN3. A plurality of interconnection layers INC are arranged on interlayer insulation film IS. Each of the plurality of interconnection layers is in contact with plug conductive layer PL.

As a result, one interconnection layer INC is electrically connected to both $p^+$ source region SC and $n^+$ contact region WC with plug conductive layer PL interposed therebetween. Another interconnection layer INC is electrically connected to gate electrode GE with plug conductive layer PL interposed therebetween. Still another interconnection layer INC is electrically connected to $p^+$ drain region DC with plug conductive layer PL interposed therebetween.

Next, a manufacturing method according to the present embodiment will be described with reference to FIGS. 8 to 15.

Figure 8:
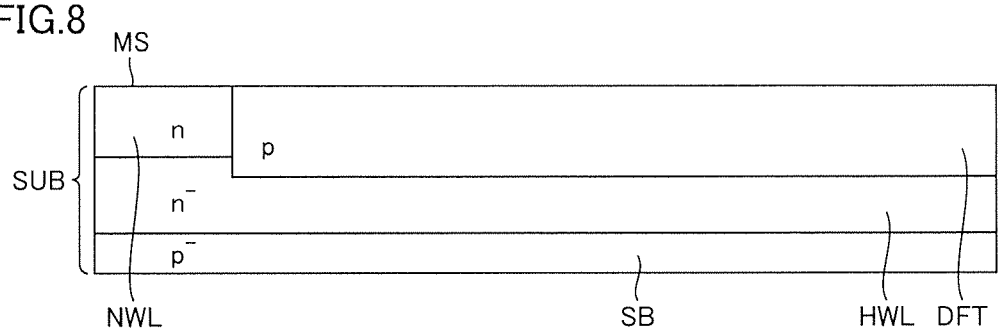
FIG. 8 is a cross-sectional view showing a first step of a method for manufacturing the semiconductor device shown in FIG. 4.

As shown in FIG. 8, $n^-$ well region HWL is formed on $p^-$ substrate region SB. N-type well region NWL and p-type drift region DFT are formed on $n^-$ well region HWL. Semiconductor substrate SUB having $p^-$ substrate region SB, $n^-$ well region HWL, n-type well region NWL, and p-type drift region DFT therein is thereby prepared.

Figure 9:
FIG. 9 is a cross-sectional view showing a second step of the method for manufacturing the semiconductor device shown in FIG. 4.

As shown in FIG. 9, gate insulation film GI formed of, for example, a silicon oxide film is formed on the main surface of semiconductor substrate SUB. Gate insulation film GI is formed to have a film thickness of, for example, several micrometers to several ten micrometers. A conductive film GE1 made of, for example, polycrystalline silicon (doped polysilicon) into which an impurity has been introduced is formed on gate insulation film GI. A hard mask layer HM formed of, for example, a silicon nitride film is formed on conductive film GE1. Each of conductive film GE1 and hard mask layer HM is formed to have a film thickness of, for example, several ten nanometers.

Thereafter, hard mask layer HM is patterned using a normal photolithography technique and a normal etching technique. Using this patterned hard mask layer HM as a mask, conductive film GE1, gate insulation film GI and semiconductor substrate SUB are etched. As a result of this etching, isolation trench TNC is formed in main surface MS of semiconductor substrate SUB.

Figure 10:
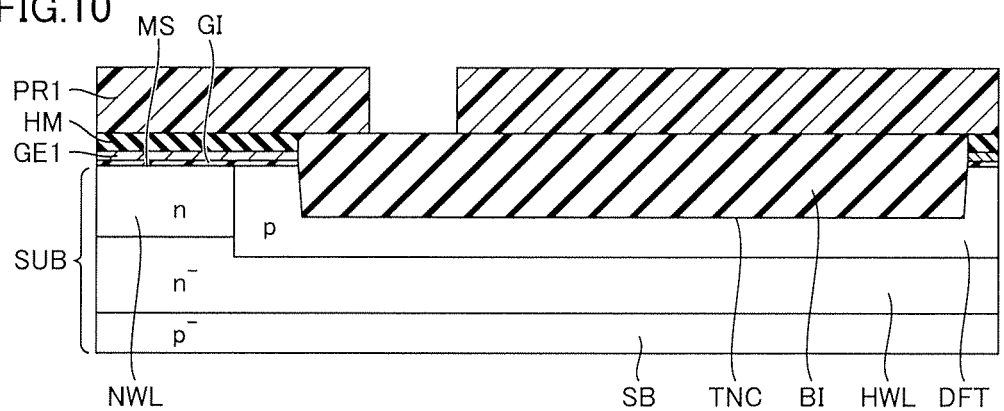
FIG. 10 is a cross-sectional view showing a third step of the method for manufacturing the semiconductor device shown in FIG. 4.

As shown in FIG. 10, an insulation film BI (buried insulation film) formed of, for example, a silicon oxide film is formed to fill isolation trench TNC. In this formation of insulation film BI, insulation film BI is formed on the entire main surface of semiconductor substrate SUB to fill isolation trench TNC, for example. Thereafter, insulation film BI is polished using, for example, CMP (Chemical Mechanical Polishing) until a surface of hard mask layer HM is exposed. As a result, insulation film BI is left only inside isolation trench TNC.

Thereafter, a photoresist pattern PR1 is formed using a normal photolithography technique. Photoresist pattern PR1 has an opening that exposes a part of a surface of insulation film BI. Using this photoresist pattern PR1 as a mask, insulation film BI is etched. After this etching, photoresist pattern PR1 is removed using, for example, ashing and the like.

Figure 11:
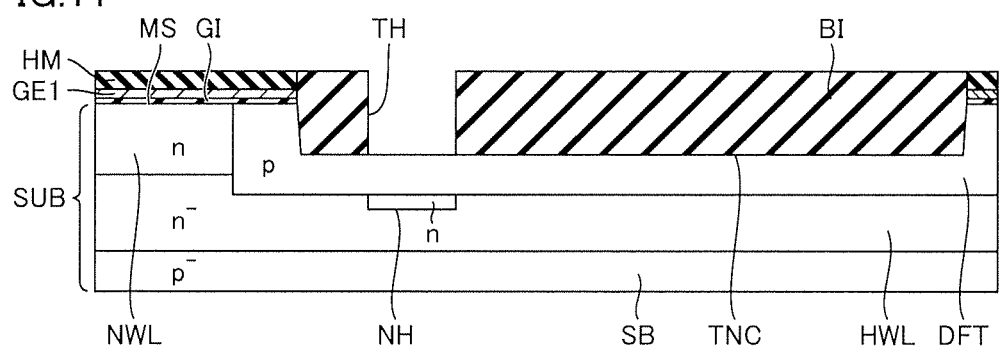
FIG. 11 is a cross-sectional view showing a fourth step of the method for manufacturing the semiconductor device shown in FIG. 4.

As shown in FIG. 11, as a result of etching described above, a through hole TH extending through insulation film BI to p-type drift region DFT is formed in insulation film BI. Through this through hole TH, an n-type impurity is injected into semiconductor substrate SUB. The conditions for ion injection of the n-type impurity are, for example, such that the injection energy is several hundred keV to several Mev and a dose amount is $10^{12}$ to $10^{13}$ cm$^{-2}$. As a result of this injection of the n-type impurity, n-type impurity region NH is formed in a region located below p-type drift region DFT and directly below through hole TH.

Figure 12:
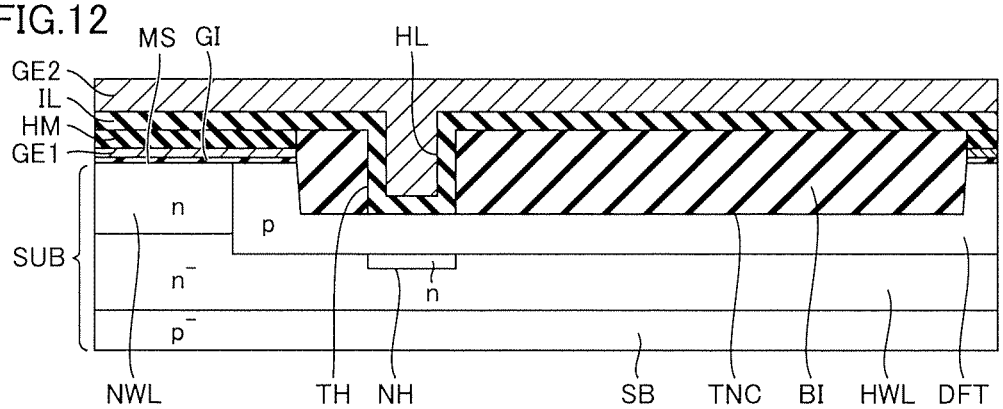
FIG. 12 is a cross-sectional view showing a fifth step of the method for manufacturing the semiconductor device shown in FIG. 4.

As shown in FIG. 12, an insulation film IL (covering insulation film) formed of, for example, a silicon oxide film is formed to cover an inner wall surface of through hole TH and to cover a top surface of each of hard mask layer HM and insulation film BI. Insulation film IL is formed to have a film thickness of, for example, approximately one third of a depth of through hole TH. A top surface of insulation film IL covering the inner wall surface of through hole TH forms an inner wall surface of recessed portion HL.

Thereafter, a conductive film GE2 made of doped polysilicon is formed to fill recessed portion HL and to cover the top surface of insulation film IL. Conductive film GE2 is formed to have a film thickness of, for example, several hundred nanometers. Thereafter, conductive film GE2 is polished using, for example, CMP until a surface of insulation film IL is exposed.

Figure 13:
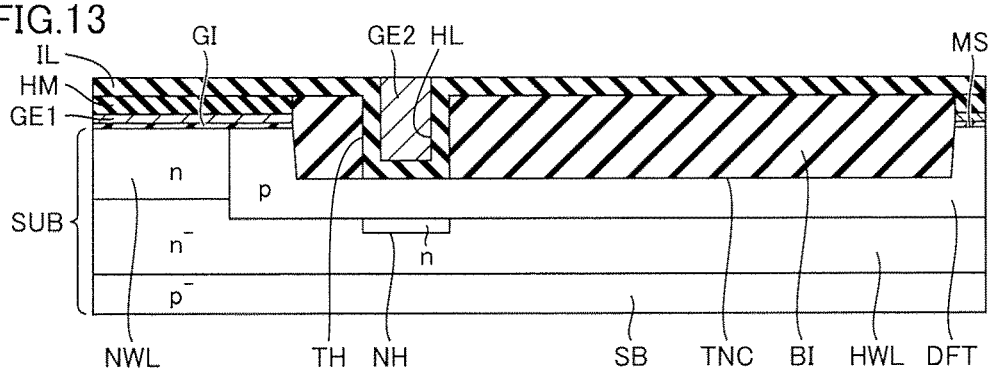
FIG. 13 is a cross-sectional view showing a sixth step of the method for manufacturing the semiconductor device shown in FIG. 4.

As shown in FIG. 13, as a result of CMP described above, conductive film GE2 is left only inside recessed portion HL. Thereafter, hard mask layer HM and a part of insulation film IL are removed by, for example, etching.

Figure 14:
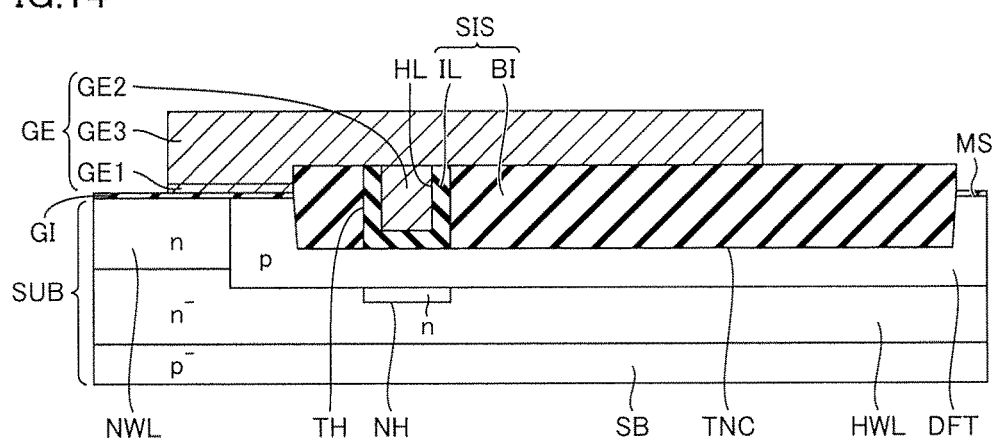
FIG. 14 is a cross-sectional view showing a seventh step of the method for manufacturing the semiconductor device shown in FIG. 4.

As shown in FIG. 14, the surface of conductive film GE1 is exposed as a result of etching removal described above. In addition, insulation film IL is left only inside through hole TH as a result of etching removal described above. Insulation film IL left inside through hole TH and insulation film BI form isolation insulation film SIS.

A conductive film GE3 made of, for example, doped polysilicon is formed on entire main surface MS of semiconductor substrate SUB. Conductive film GE3 is formed to have a film thickness of, for example, several ten nanometers. Thereafter, conductive films GE3 and GE1 are patterned using a normal photolithography technique and a normal etching technique. Gate electrode GE formed of conductive films GE1, GE2 and GE3 is thereby formed.

Figure 15:
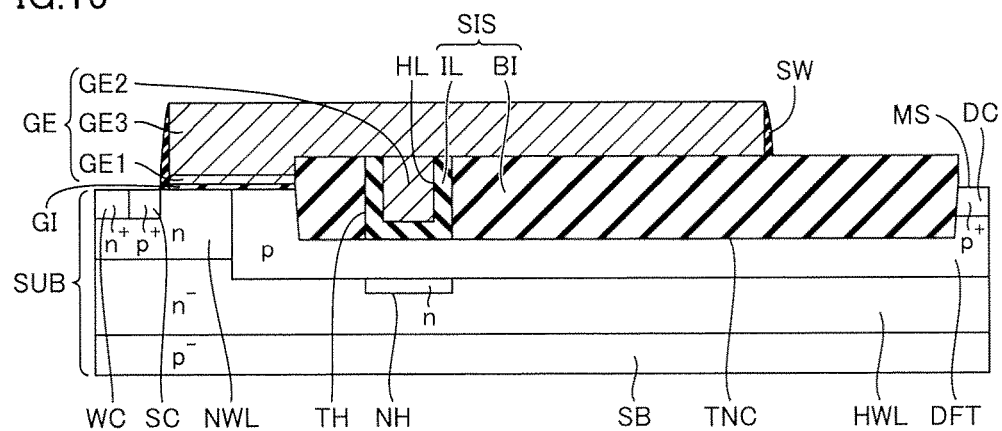
FIG. 15 is a cross-sectional view showing an eighth step of the method for manufacturing the semiconductor device shown in FIG. 4.

As shown in FIG. 15, a side wall insulation film SW is formed on a side wall of gate electrode GE. Thereafter, using ion injection and the like, an n-type impurity and a p-type impurity are injected into main surface MS of semiconductor substrate SUB. P+ source region SC, p+ drain region DC and n+ contact region WC are thereby formed in main surface MS of semiconductor substrate SUB.

As shown in FIG. 4, interlayer insulation film IS, plug conductive layer PL, interconnection layer INC and the like are formed, and thus, the semiconductor device according to the present embodiment is manufactured.

Conductive films GE1, GE2 and GE3 in FIG. 15 are shown as one gate electrode GE in FIG. 4. In addition, insulation films IL and BI in FIG. 15 are shown as one isolation insulation film SIS in FIG. 4. In addition, side wall insulation film SW in FIG. 15 is omitted in FIG. 4.

In addition, nLDMOS transistor LNT in FIG. 2 has a configuration of a conductivity type opposite to that of pLDMOS transistor LPT described above. Specifically, p− well region HWL (first well region) is arranged on n+ buried region BL. N− drift region DFT and p-type well region PWL (second well region) are arranged on p− well region HWL. N+ source region SC and p+ contact region WC are formed in main surface MS inside p-type well region PWL. N+ drain region DC is formed in main surface MS inside n− drift region DFT. A p-type impurity region PH (first impurity region) is arranged below n− drift region DFT so as to have a portion located directly below recessed portion HL.

Next, the function and effect of the present embodiment will be described in comparison with a comparative example not having n-type impurity region NH in FIG. 4.

In the BiC-DMOS (Bipolar Complementary Metal Oxide Semiconductor) field, an LDMOS transistor, a CMOS transistor and a bipolar transistor are mounted together as shown in FIG. 2. In this field as well, design scaling has been in progress. As a result, the STI has been increasingly used instead of conventional LOCOS (LoCal Oxidation of Silicon).

In this case, the STI is also used in a drift region of the LDMOS transistor. In the case of the STI, a corner portion of an isolation trench has a sharp shape. Therefore, when a high voltage is applied to a drain, an electric field is likely to concentrate on the corner portion of the isolation trench. Due to this concentration of the electric field, impact ionization is likely to occur at an end of the STI. An electron-hole pair generated due to impact ionization produces an interface state or is injected into an oxide film by diffraction. As a result, a problem of greater fluctuations in hot carriers becomes pronounced. Particularly, in the case of a pLDMOS transistor, injection of electrons into a gate insulation film causes a breakdown in the gate insulation film.

Accordingly, as to the configuration according to the present embodiment in FIG. 4 and the configuration according to the comparative example not having n-type impurity region NH in FIG. 4, the present inventor investigated the effect of suppressing impact ionization using device simulation. The results are shown in FIGS. 16 and 17.

Figure 16:
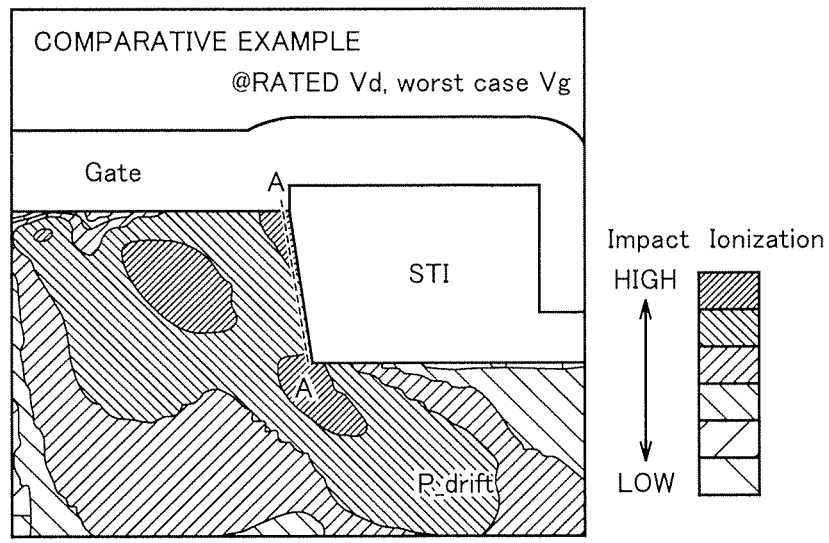
FIG. 16 is a diagram showing an impact ionization rate distribution of a semiconductor device according to a comparative example.
Figure 17:
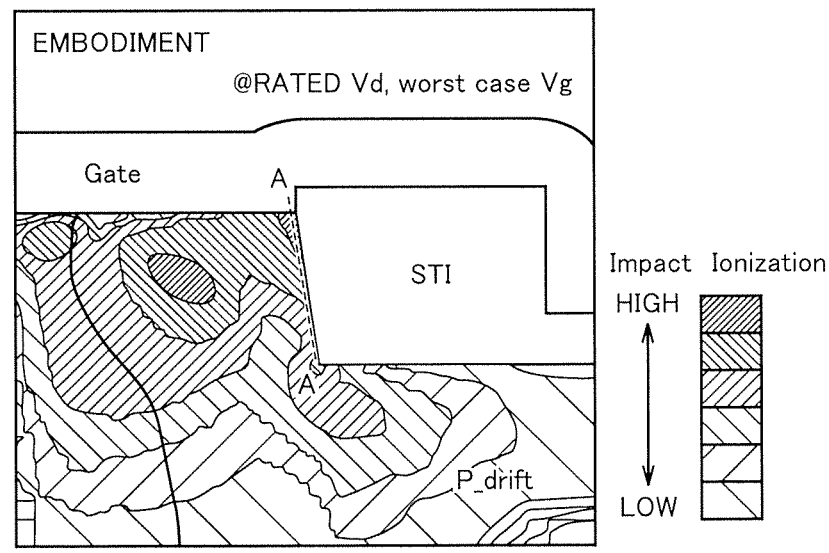
FIG. 17 is a diagram showing an impact ionization rate distribution of the semiconductor device according to the first embodiment.

FIG. 16 shows an impact ionization rate distribution of the semiconductor device according to the comparative example, and FIG. 17 shows an impact ionization rate distribution of the semiconductor device according to the present embodiment. It can be seen from these results that the impact ionization rate is high at the lower end of the STI on the source region side in the comparative example as shown in FIG. 16. In contrast, it can be seen that the impact ionization rate is lower at the lower end of the STI on the source region side in the present embodiment than in the comparative example as shown in FIG. 17.

In addition, the present inventor investigated an electric field strength and an impact ionization occurrence rate along line A-A in each of FIGS. 16 and 17. The results are shown in FIGS. 18 and 19.

Figure 18:
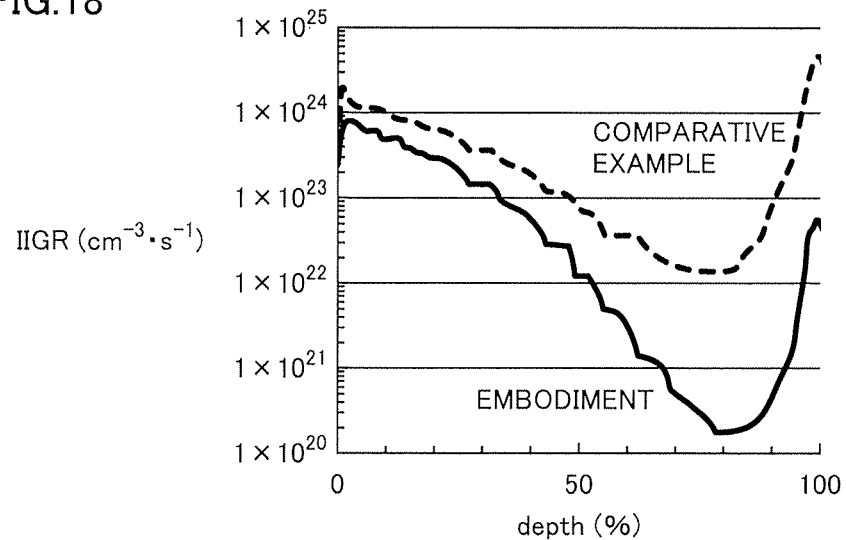
FIG. 18 is a diagram showing an electric field strength along line A-A in FIGS. 16 and 17.
Figure 19:
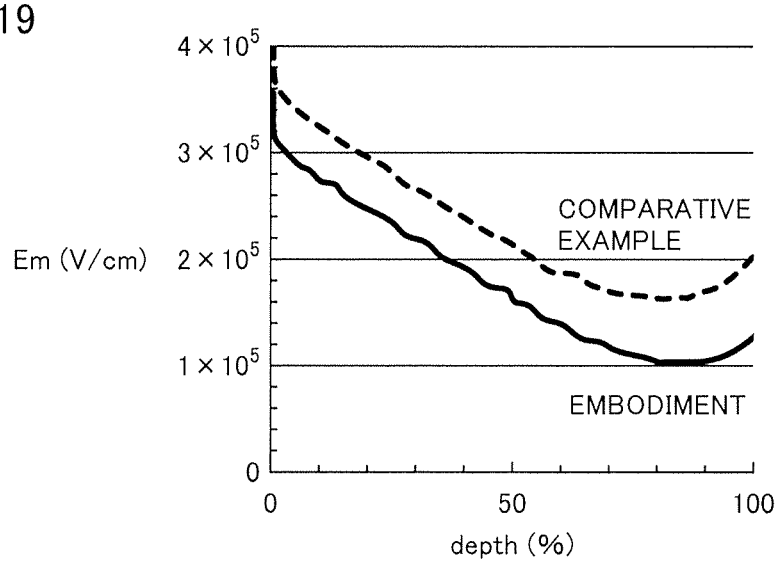
FIG. 19 is a diagram showing an impact ionization occurrence rate along line A-A in FIGS. 16 and 17.

FIG. 18 shows an electric field strength along line A-A in each of FIGS. 16 and 17, and FIG. 19 shows an impact ionization occurrence rate along line A-A in each of FIGS. 16 and 17. It can be seen from the results in FIGS. 18 and 19 that both the electric field strength and the impact ionization occurrence rate are lower in the present embodiment than in the comparative example. It can be seen that particularly in the vicinity of the lower end of the STI on the source region side, the electric field strength and the impact ionization occurrence rate are lower in the present embodiment than in the comparative example.

Furthermore, the present inventor investigated a relation between an ON resistance Rsp and a gate current Ig as well as a relation between an OFF breakdown voltage BV off and gate current Ig in each of the present embodiment and the comparative example. The results are shown in FIGS. 20 and 21.

Figure 20:
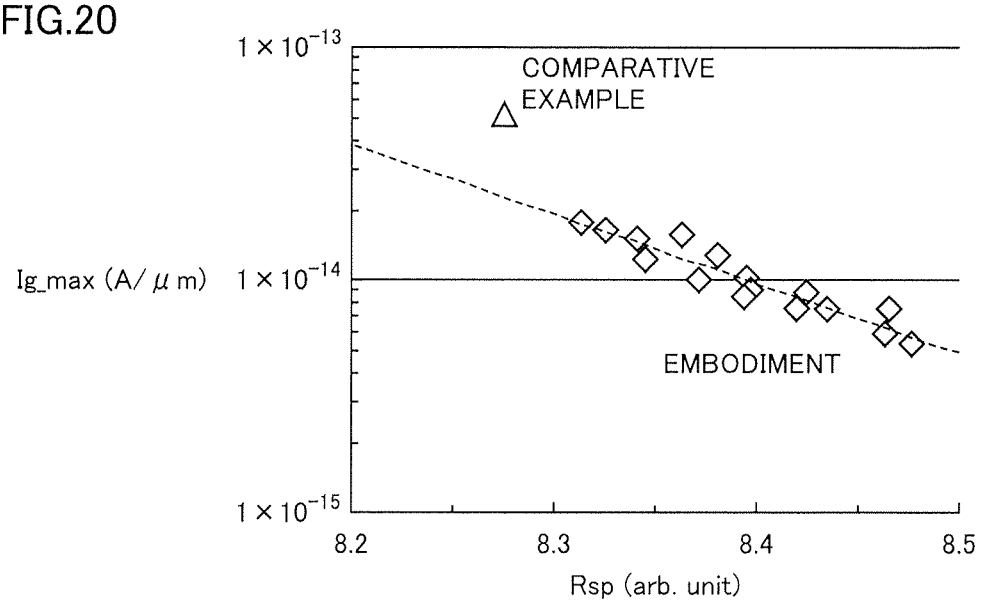
FIG. 20 is a diagram showing a relation between an ON resistance Rsp and a gate current Ig in each of the first embodiment and the comparative example.
Figure 21:
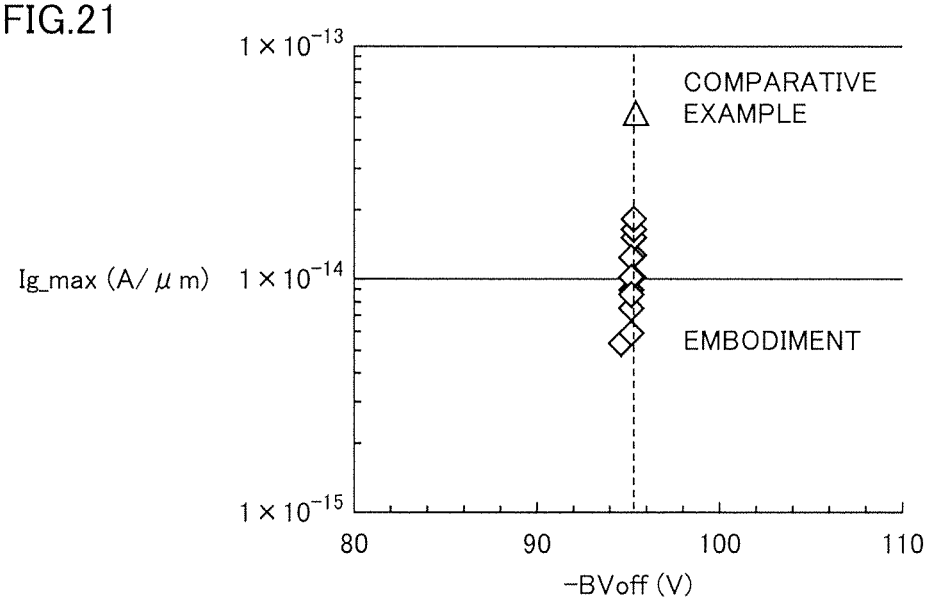
FIG. 21 is a diagram showing a relation between an OFF breakdown voltage BV off and gate current Ig in each of the first embodiment and the comparative example.

FIG. 20 shows a relation between ON resistance Rsp and gate current Ig in each of the present embodiment and the comparative example, and FIG. 21 shows a relation between OFF breakdown voltage BV off and gate current Ig in each of the present embodiment and the comparative example. It can be seen from the results in FIGS. 20 and 21 that it is possible to reduce gate current Ig while maintaining OFF breakdown voltage BV off in the present embodiment, although ON resistance Rsp increases by 1 to 2% in the present embodiment in comparison with the comparative example.

"Gate current Ig" herein refers to a current flowing with gate insulation film GI and the like interposed between semiconductor substrate SUB and gate electrode GE. Therefore, small gate current Ig means that an amount of carriers injected from semiconductor substrate SUB into gate electrode GE is small. Thus, based on the above-described result that gate current Ig is reduced, it can be seen that injection of the hot carriers into gate electrode GE can be suppressed in the present embodiment in comparison with the comparative example.

Additionally, the present inventor investigated a potential distribution in the semiconductor substrate at the application of certain stress to the element to be measured in each of the present embodiment and the comparative example. The results are shown in FIGS. 22 and 23.

Figure 22:
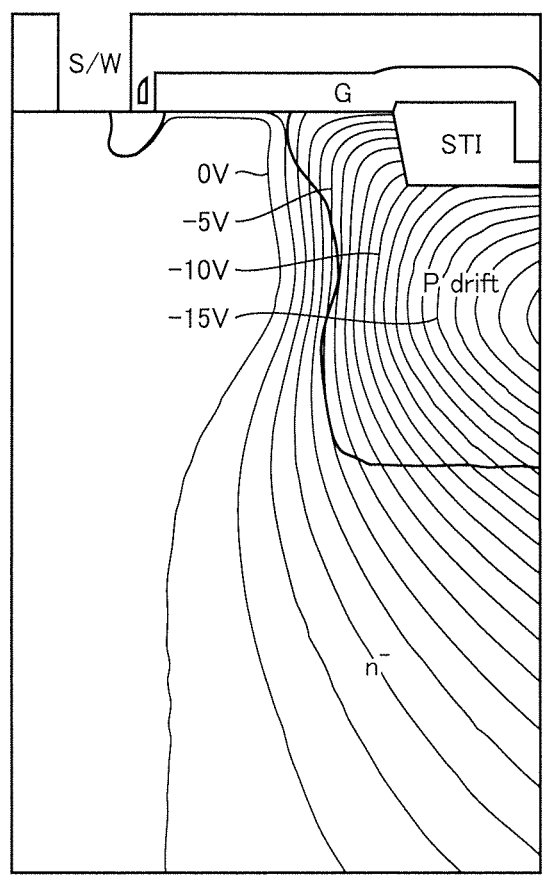
FIG. 22 is a diagram showing equipotential lines of the semiconductor device according to the comparative example.
Figure 23:
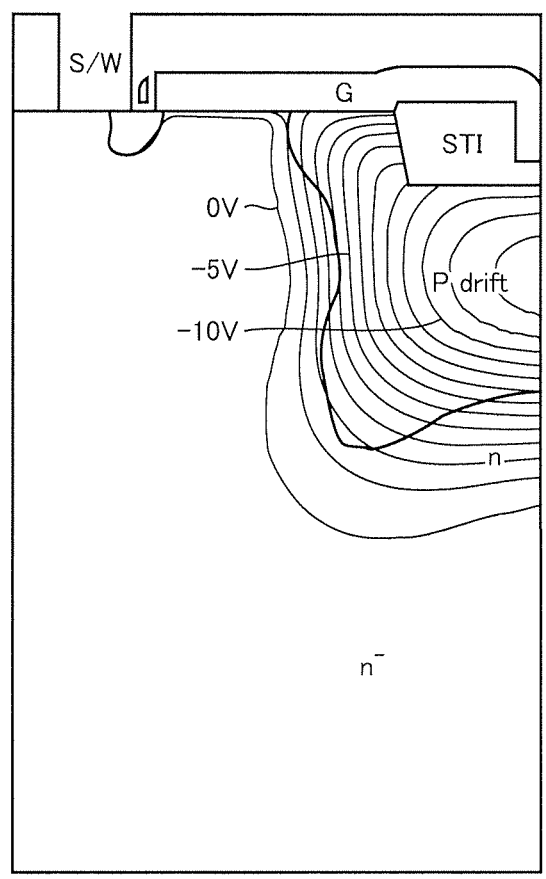
FIG. 23 is a diagram showing equipotential lines of the semiconductor device according to the first embodiment.

FIG. 22 shows equipotential lines of the semiconductor device according to the comparative example, and FIG. 23 shows equipotential lines of the semiconductor device according to the present embodiment. In this simulation, a gate voltage Vg was set at −1.3 V and a drain voltage Vd was set at −80 V for the element having an ON breakdown voltage of 80 V, and a potential distribution was observed.

It can be seen from the results in FIGS. 22 and 23 that −10 V is obtained at the lower end of the STI on the source region side in the comparative example, whereas −8 V is obtained at the lower end of the STI on the source region side in the present embodiment. In addition, it can be seen that the spacing between the equipotential lines is greater in the vicinity of the end of the STI on the source region side and the electric field is relaxed in the present embodiment than in the comparative example.

Based on these results, it is conceivable that, since n-type impurity region NH (FIG. 4) is arranged, the electric field at the end of the STI is relaxed and impact ionization is suppressed, and thus, injection of the hot carriers into gate electrode GE is further suppressed in the present embodiment.

As described above, in the present embodiment, n-type impurity region NH is arranged in the region located below p-type drift region DFT and directly below recessed portion HL as shown in FIG. 4. Therefore, it is possible to further suppress injection of the hot carriers into gate electrode GE while maintaining OFF breakdown voltage BV off as described above, and thus, to suppress gate current Ig.

When n-type impurity region NH is arranged only in the region located directly below recessed portion HL in the present embodiment, it is also possible to suppress injection of the hot carriers into gate electrode GE and obtain a high breakdown voltage due to a RESURF (REduced SURface Field) effect. This will be described below.

Let us assume that recessed portion HL is not provided in isolation insulation film SIS and n-type impurity region NH is arranged in the entire region located directly below isolation trench TNC in the configuration shown in FIG. 4. In this case, n-type impurity region NH is arranged in the entire region located directly below isolation trench TNC, and thus, it is impossible to obtain the RESURF effect obtained by lateral joining of p$^-$ drift region DFT and n$^-$ well region HWL. As a result, the concentration of the electric field is likely to occur and the breakdown voltage is reduced.

In order to suppress the reduction in breakdown voltage, it is necessary to increase the p-type impurity concentration of p$^-$ drift region DFT. However, when the p-type impurity concentration of p$^-$ drift region DFT is increased, the concentration of the electric field near the end of the STI is promoted. As a result, injection of the hot carriers into gate electrode GE is promoted.

In contrast, in the present embodiment, n-type impurity region NH is arranged only in the region located directly below recessed portion HL. Therefore, a sufficient length of lateral joining of p$^-$ drift region DFT and n$^-$ well region HWL can be ensured. As a result, high breakdown voltage can be obtained due to the RESURF effect.

In other words, a depletion layer extends upward and downward from the pn junction of p$^-$ drift region DFT and n$^-$ well region HWL, and thus, the electric field distribution is made uniform and the concentration of the electric field is relaxed. As a result, the breakdown voltage is enhanced.

In addition, it is unnecessary to increase the p-type impurity concentration of p$^-$ drift region DFT in order to obtain high breakdown voltage. Therefore, the promotion of injection of the hot carriers occurring in the case of increasing the p-type impurity concentration of p$^-$ drift region DFT does not occur.

As described above, it is possible to suppress injection of the hot carriers into gate electrode GE and obtain high breakdown voltage due to the RESURF effect.

In addition, in the present embodiment, n-type impurity region NH is located within the dimensional range of one third of length Ld of isolation trench TNC from end TNCS of isolation trench TNC on the source region SC side. Since n-type impurity region NH is located within such a range, high breakdown voltage due to the above-described RESURF effect can be maintained.

If dimension Ls between end HLS of recessed portion HL on the source region SC side and end TNCS of isolation trench TNC on the source region SC side is smaller than the film thickness of gate insulation film GI, the hot carriers are likely to be injected into gate electrode GE through the thin portion of isolation insulation film SIS. Since above-described dimension Ls is not smaller than the film thickness of gate insulation film GI, injection of the hot carriers into gate electrode GE through the thin portion of isolation insulation film SIS is suppressed.

In addition, in the above-described source-drain direction, the dimension between end NHS of n-type impurity region NH on the source region SC side and end TNCS of isolation trench TNC on the source region SC side is not longer than one third of above-described length Ld of isolation trench TNC. As a result, n-type impurity region NH allows sufficient suppression of injection of the hot carriers into gate electrode GE.

In addition, as shown in FIG. 6, end NHD of n-type impurity region NH on the drain region DC side is located closer to source region SC than above-described position P1. As a result, injection of the hot carriers into gate electrode GE can be suppressed and the above-described RESURF effect can be obtained.

In addition, as shown in FIG. 4, the n$^+$ well region having an n-type impurity concentration lower than that of n-type well region NWL is connected to p$^+$ drift region DFT along the lateral direction to form a pn junction. As a result, the above-described RESURF effect can be obtained.

Second Embodiment

Figure 24:
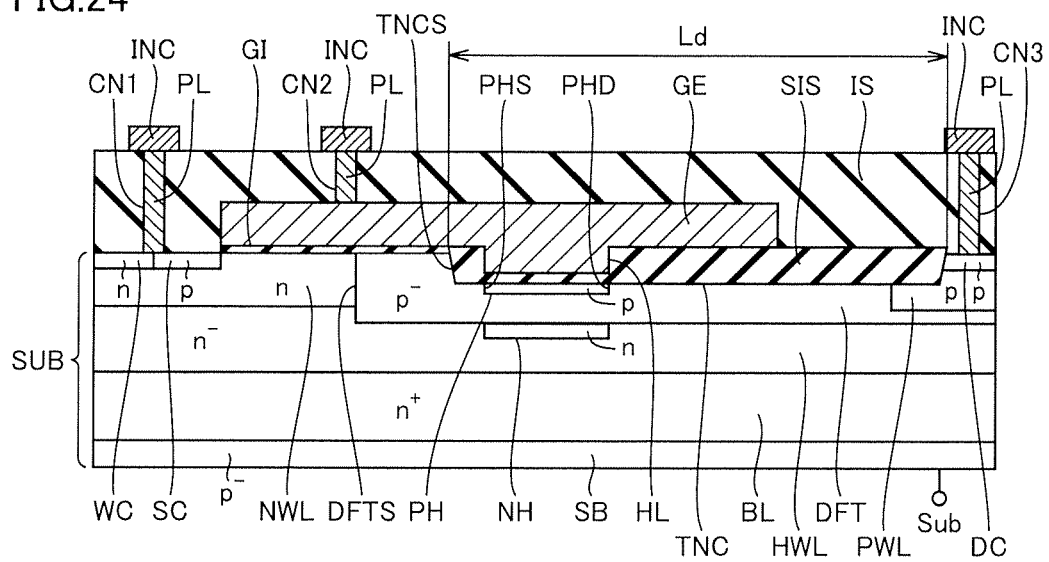
FIG. 24 is a cross-sectional view showing a configuration of a semiconductor device according to a second embodiment.

As shown in FIG. 24, a configuration according to the present embodiment is different from the configuration according to the first embodiment in that p-type impurity region PH (second impurity region) is added. P-type impurity region PH has a p-type impurity concentration higher than that of p$^-$ drift region DFT. This p-type impurity region PH preferably has a concentration peak lower than that of n-type impurity region NH.

P-type impurity region PH is arranged in a region located directly below recessed portion HL. As long as p-type impurity region PH is arranged inside p$^-$ drift region DFT, p-type impurity region PH may be in contact with isolation insulation film SIS or may not be in contact with isolation insulation film SIS. P-type impurity region PH is preferably spaced apart from n-type impurity region NH in the depth direction.

An end PHD of p-type impurity region PH on the drain region DC side is located closer to source region SC than position P1 described with reference to FIG. 6. An end PHS of p-type impurity region PH on the source region SC side is preferably located closer to drain region DC than position P2 described with reference to FIG. 6.

In addition, p-type impurity region PH is preferably arranged only in the region located directly below recessed portion HL. Specifically, it is preferable that p-type impurity region PH is arranged inside region RDB described with reference to FIG. 3 and does not protrude from region RDB in a plan view.

In addition, end PHS of p-type impurity region PH on the source region SC side is located closer to drain region DC than end TNCS of isolation trench TNC on the source region SC side. In addition, end PHS of p-type impurity region PH on the source region SC side is located closer to drain region DC than end DFTS of p$^-$ drift region DFT on the source side.

However, similarly to n-type impurity region NH shown in FIG. 7, end PHS of p-type impurity region PH on the source side may be located closer to source region SC than end TNCS of isolation trench TNC on the source region SC side. In addition, end PHS of p-type impurity region PH on the source side may be located closer to source region SC than end DFTS of p$^-$ drift region DFT on the source region SC side.

In addition, p-type impurity region PH is located within a dimensional range of one third of length Ld of isolation trench TNC from end TNCS of isolation trench TNC on the source region SC side.

Specifically, a dimension in the above-described source-drain direction between end PHD of p-type impurity region PH on the drain region DC side and end TNCS of isolation trench TNC on the source region SC side is not longer than one third of above-described length Ld of isolation trench TNC.

In addition, a dimension in the above-described source-drain direction between end PHS of p-type impurity region PH on the source region SC side and end TNCS of isolation trench TNC on the source region SC side is not longer than one third of above-described length Ld of isolation trench TNC.

The configuration according to the present embodiment other than described above is substantially the same as the above-described configuration according to the first embodiment, and thus, the same components are denoted by the same reference characters and description thereof will not be repeated.

Figure 25:
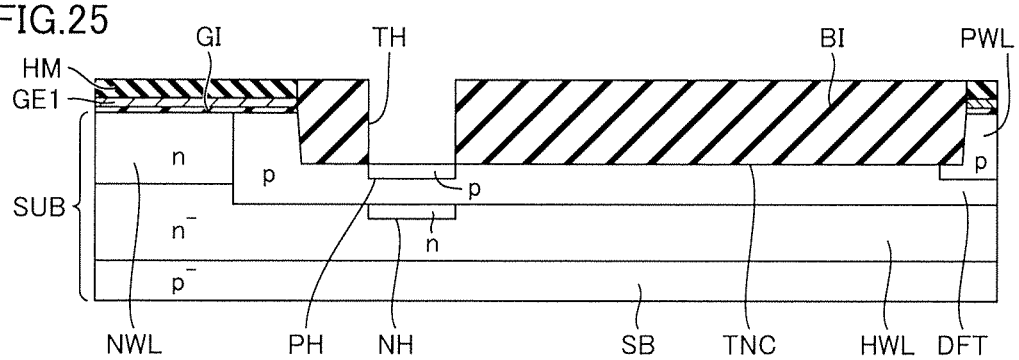
FIG. 25 is a cross-sectional view showing a method for manufacturing the semiconductor device shown in FIG. 24.

Next, a method for manufacturing the semiconductor device according to the present embodiment will be described with reference to FIG. 25.

First, the manufacturing method according to the present embodiment undergoes the steps similar to the steps in the first embodiment shown in FIGS. 8 to 10. Thereafter, in the present embodiment, as shown in FIG. 25, an n-type impurity and a p-type impurity are injected into semiconductor substrate SUB through hole TH of insulation film BI. N-type impurity region NH and p-type impurity region PH are thereby formed in semiconductor substrate SUB.

The conditions for ion injection of the p-type impurity for forming p-type impurity region PH are, for example, such that the energy is several ten keV and a dose amount is $10^{11}$ to $10^{12}$ cm$^{-2}$. In order to prevent knock-on of the injected ions, this ion injection of the p-type impurity is preferably performed before the ion injection of the n-type impurity for forming n-type impurity region NH.

Thereafter, the manufacturing method according to the present embodiment undergoes the steps similar to the steps in the first embodiment shown in FIGS. 12 to 15. The semiconductor device according to the present embodiment shown in FIG. 24 is thereby manufactured.

Next, the function and effect of the present embodiment will be described.

The present inventor investigated a relation between ON resistance Rsp and gate current Ig as well as a relation between OFF breakdown voltage BV off and gate current Ig in the present embodiment. The results are shown in FIGS. 26 and 27.

Figure 26:
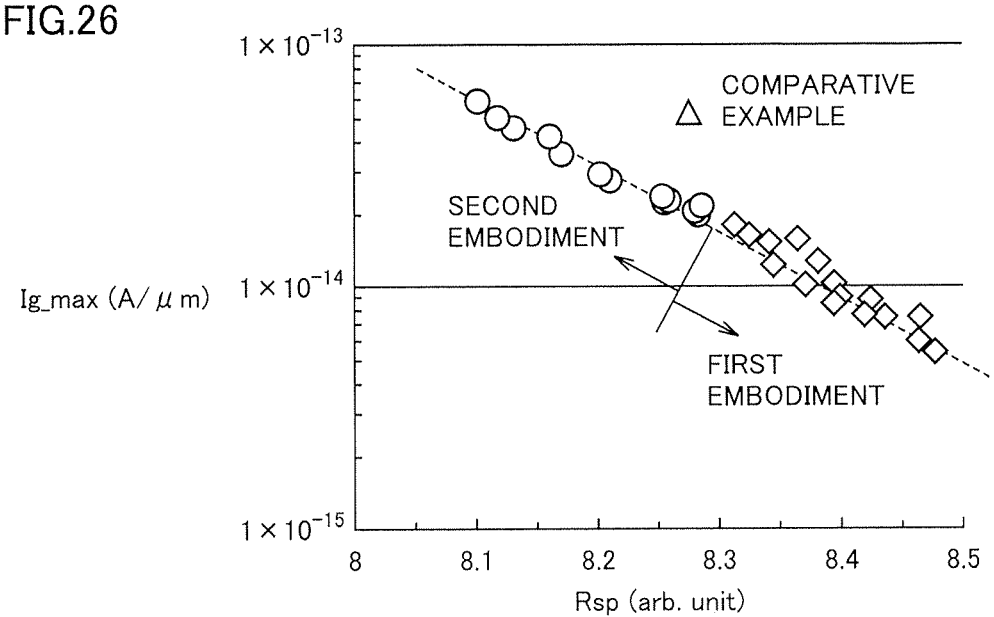
FIG. 26 is a diagram showing a relation between ON resistance Rsp and gate current Ig in each of the first and second embodiments and the comparative example.
Figure 27:
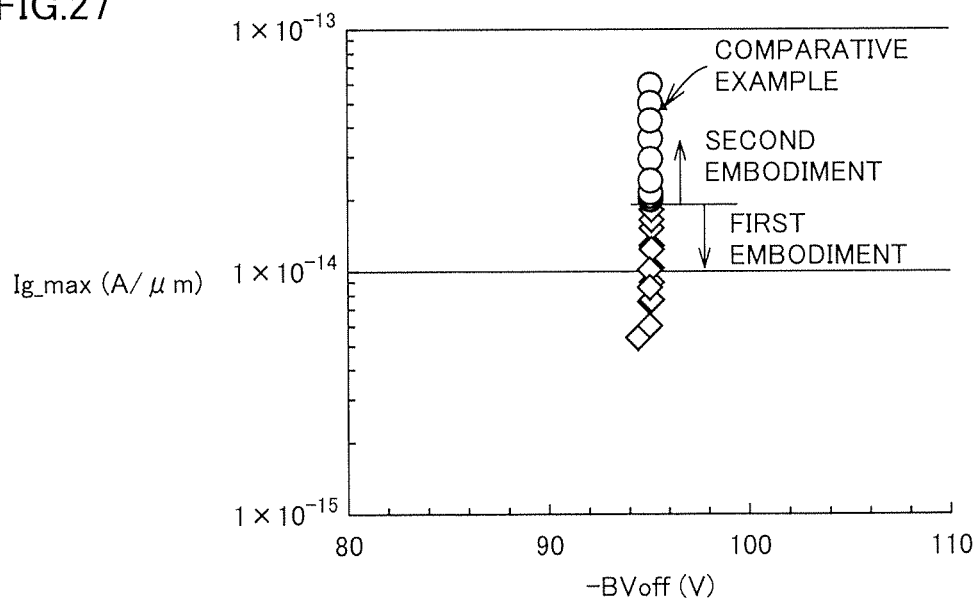
FIG. 27 is a diagram showing a relation between OFF breakdown voltage BV off and gate current Ig in each of the first and second embodiments and the comparative example.

FIG. 26 shows a relation between ON resistance Rsp and gate current Ig in each of the present embodiment, the first embodiment and the comparative example. FIG. 27 shows a relation between OFF breakdown voltage BV off and gate current Ig in each of the present embodiment, the first embodiment and the comparative example. It can be seen from the results in FIGS. 26 and 27 that gate current Ig can be reduced in the present embodiment in comparison with the comparative example, and ON resistance Rsp can be further reduced in the present embodiment in comparison with the first embodiment.

As described above, according to the present embodiment, p-type impurity region PH is added directly below recessed portion HL, and thus, gate current Ig can be reduced and ON resistance Rsp can be further reduced.

If p-type impurity region PH has a concentration peak higher than that of n-type impurity region NH, the effect of relaxing the electric field by n-type impurity region NH may be canceled by p-type impurity region PH.

In the present embodiment, p-type impurity region PH has a concentration peak lower than that of n-type impurity region NH. As a result, cancelation, by p-type impurity region PH, of the effect of relaxing the electric field by n-type impurity region NH is suppressed.

In addition, end PHD of p-type impurity region PH on the drain region DC side is located closer to source region SC than a position distanced from recessed portion HL toward the drain region DC side by dimension H in the depth direction from a bottom portion of recessed portion HL to a bottom portion of isolation trench TNC. As a result, injection of the hot carriers into gate electrode GE can be suppressed and the above-described RESURF effect can be obtained.

Third Embodiment

Figure 28:
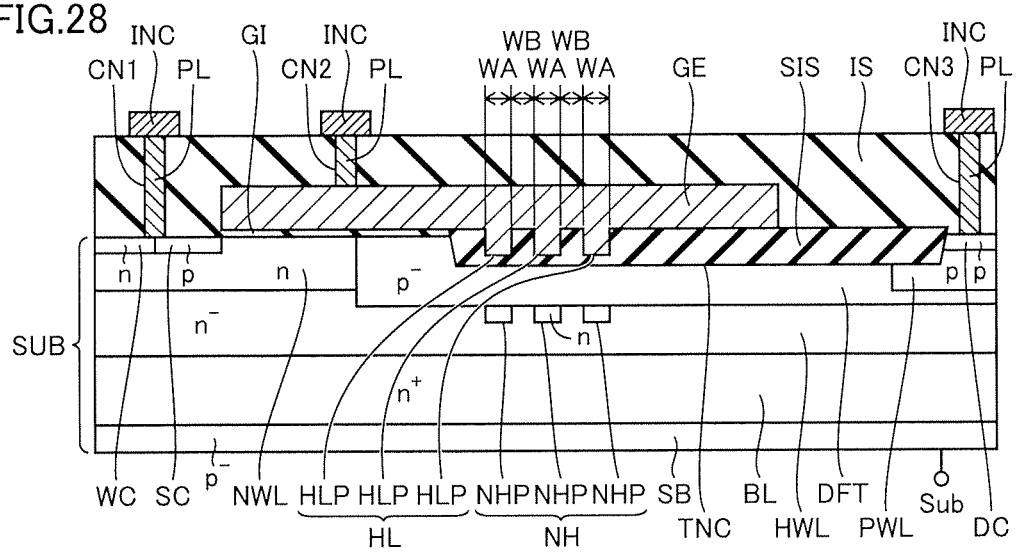
FIG. 28 is a cross-sectional view showing a configuration of a semiconductor device according to a third embodiment.

As shown in FIG. 28, a semiconductor device according to the present embodiment is different from the configuration according to the first embodiment in that recessed portion HL has a plurality of concave portions HLP and n-type impurity region NH has a plurality of n-type region portions (first region portions) NHP.

The plurality of concave portions HLP are arranged to run with a spacing therebetween in a plan view. In other words, the plurality of concave portions HLP are formed to have a so-called strip shape in a plan view. A width WA of each of the plurality of concave portions HLP is greater than a distance WB between adjacent concave portions HLP of the plurality of concave portions HLP.

In addition, the plurality of n-type region portions NHP are spaced apart from one another. The plurality of n-type region portions NHP are arranged in regions located directly below the plurality of concave portions HLP, respectively.

The configuration according to the present embodiment other than described above is substantially the same as the configuration according to the first embodiment, and thus, the same components are denoted by the same reference characters and description thereof will not be repeated.

Next, a method for manufacturing the semiconductor device according to the present embodiment will be described with reference to FIGS. 29 to 33. Although two concave portions HLP and two n-type region portions are shown in FIGS. 29 to 33, three concave portions HLP and three n-type region portions may be provided as shown in FIG. 24.

Figure 29:
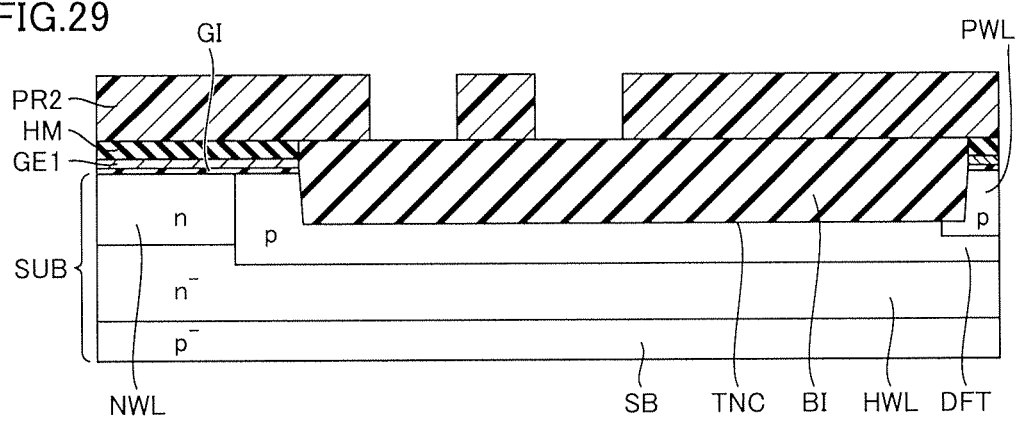
FIG. 29 is a cross-sectional view showing a first step of a method for manufacturing the semiconductor device shown in FIG. 28.

First, the manufacturing method according to the present embodiment undergoes the steps similar to the steps in the first embodiment shown in FIGS. 8 and 9. Thereafter, in the present embodiment, as shown in FIG. 29, a photoresist pattern PR2 is formed using a normal photolithography technique. Photoresist pattern PR2 has an opening that exposes a part of a surface of insulation film BI. Using this photoresist pattern PR2 as a mask, insulation film BI is etched. After this etching, photoresist pattern PR2 is removed using, for example, ashing and the like.

Figure 30:
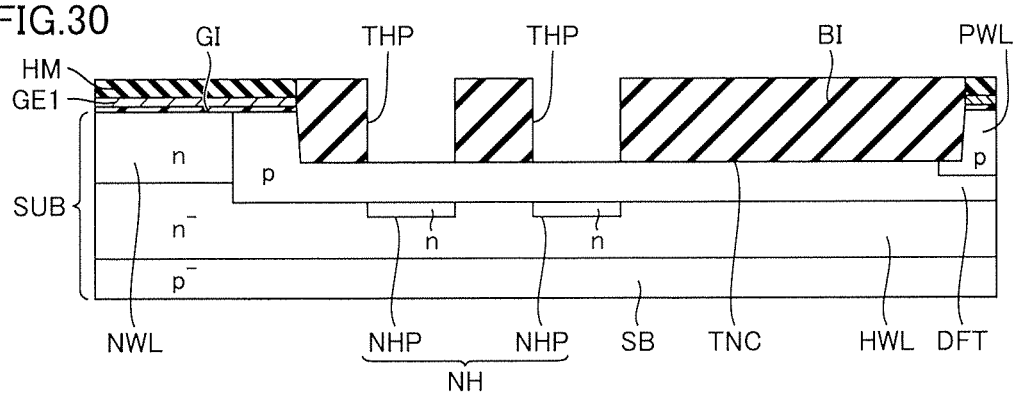
FIG. 30 is a cross-sectional view showing a second step of the method for manufacturing the semiconductor device shown in FIG. 28.

As shown in FIG. 30, as a result of etching described above, a plurality of through hole portions THP extending through insulation film BI to p-type drift region DFT are formed in insulation film BI. An n-type impurity is injected into semiconductor substrate SUB through the plurality of through hole portions THP. The conditions for ion injection of the n-type impurity are, for example, such that the injection energy is several hundred keV to several MeV and a dose amount is $10^{12}$ to $10^{13}$ cm$^{-2}$. As a result of this injection of the n-type impurity, the plurality of n-type region portions NHP are formed below p-type drift region DFT and directly below the plurality of through hole portions THP. The plurality of n-type region portions NHP form n-type impurity region NH.

Figure 31:
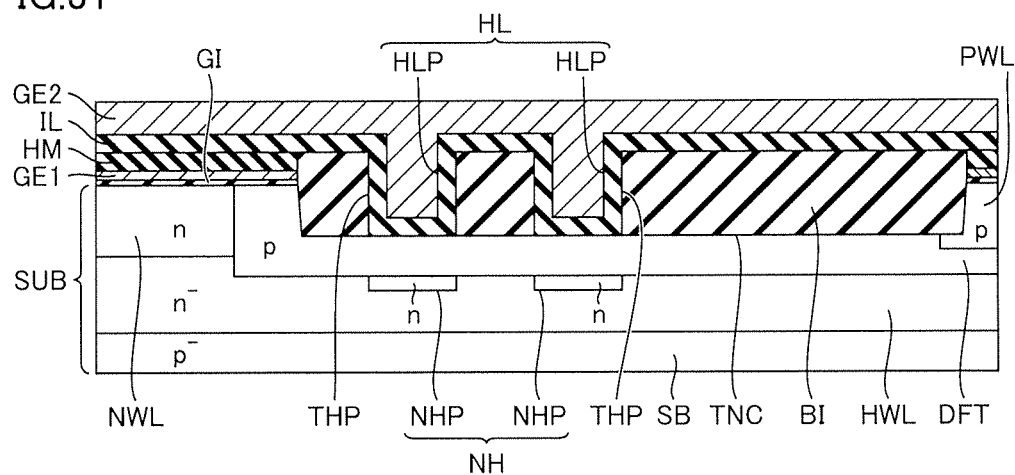
FIG. 31 is a cross-sectional view showing a third step of the method for manufacturing the semiconductor device shown in FIG. 28.

As shown in FIG. 31, insulation film IL formed of, for example, a silicon oxide film is formed to cover an inner wall surface of each of the plurality of through hole portions THP and to cover a top surface of each of hard mask layer HM and insulation film BI. Insulation film IL is formed to have a film thickness of, for example, approximately one third of a depth of through hole portion THP. A top surface of insulation film IL covering the inner wall surface of through hole portion THP forms an inner wall surface of concave portion HLP.

Thereafter, conductive film GE2 made of doped polysilicon is formed to fill the plurality of concave portions HLP and to cover the top surface of insulation film IL. Conductive film GE2 is formed to have a film thickness of, for example, several hundred nanometers. Thereafter, conductive film GE2 is polished using, for example, CMP until a surface of insulation film IL is exposed.

Figure 32:
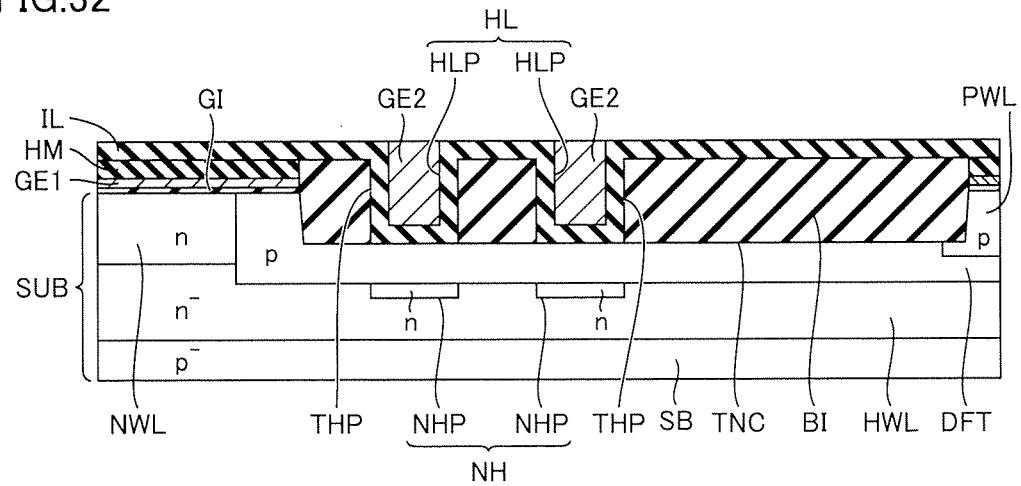
FIG. 32 is a cross-sectional view showing a fourth step of the method for manufacturing the semiconductor device shown in FIG. 28.

As shown in FIG. 32, as a result of CMP described above, conductive film GE2 is left only inside each of the plurality of concave portions HLP. Thereafter, hard mask layer HM and a part of insulation film IL are removed by, for example, etching.

Figure 33:
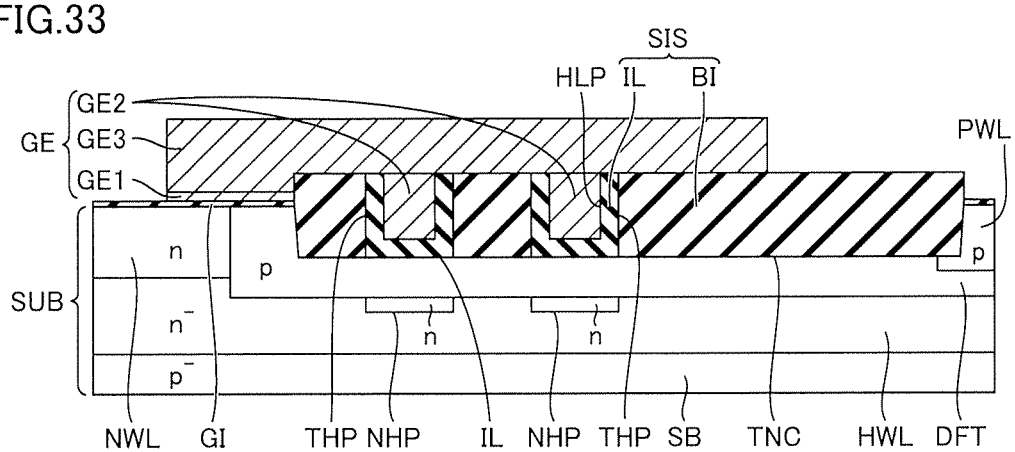
FIG. 33 is a cross-sectional view showing a fifth step of the method for manufacturing the semiconductor device shown in FIG. 28.

As shown in FIG. 33, the surface of conductive film GE1 is exposed as a result of etching removal described above. In addition, insulation film IL is left only inside through holes TH as a result of etching removal described above. Insulation film IL left inside through holes IL and insulation film BI form isolation insulation film SIS.

Conductive film GE3 made of, for example, doped polysilicon is formed on entire main surface MS of semiconductor substrate SUB. Conductive film GE3 is formed to have a film thickness of, for example, several ten nanometers. Thereafter, conductive films GE3 and GE1 are patterned using a normal photolithography technique and a normal etching technique. Gate electrode GE formed of conductive films GE1, GE2 and GE3 is thereby formed.

Thereafter, the manufacturing method according to the present embodiment undergoes the step similar to the step in the first embodiment shown in FIG. 15. The semiconductor device according to the present embodiment having the configuration equivalent to the configuration shown in FIG. 28 is thereby manufactured.

Next, the function and effect of the present embodiment will be described in comparison with a comparative example shown in FIGS. 34 to 35.

Figure 34:
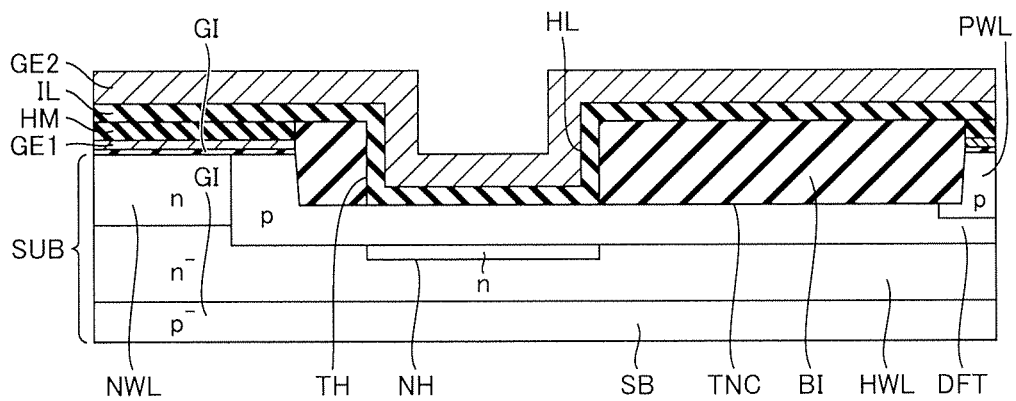
FIG. 34 is a cross-sectional view showing a first step of a method for manufacturing a semiconductor device according to a comparative example.
Figure 35:
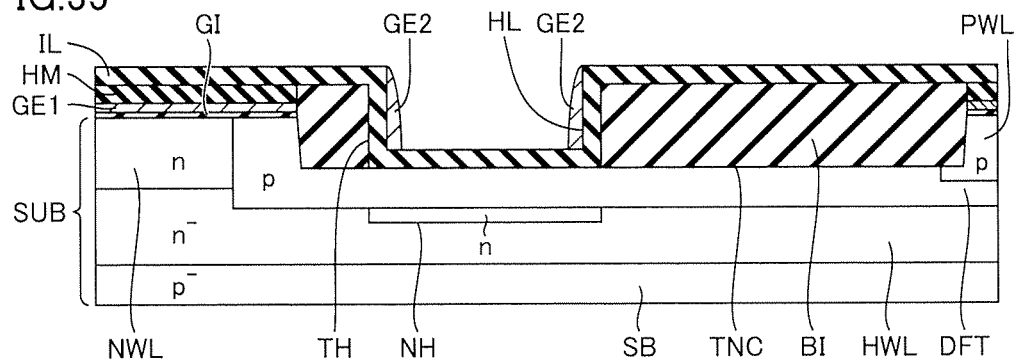
FIG. 35 is a cross-sectional view showing a second step of the method for manufacturing the semiconductor device according to the comparative example.

In the comparative example, as shown in FIG. 34, one wide recessed portion HL is formed. When conductive film GE2 is formed and is etched back as shown in FIG. 35 in this case, conductive film GE2 cannot fill recessed portion HL. In this case, conductive film GE2 is left in a side wall shape only on a side wall of recessed portion HL.

In contrast, in the present embodiment, as shown in FIG. 28, recessed portion HL has the plurality of concave portions HLP. Therefore, it is possible to ensure a greater width (e.g., 3×WA+2×WB) of the plurality of concave portions HLP as a whole, while reducing width WA of one concave portion HLP.

Therefore, injection of the hot carriers into gate electrode GE can be suppressed and conductive film GE2 can fill each concave portion HLP.

In addition, in the manufacturing method according to the present embodiment, the plurality of concave portions HLP can be formed without adding a photomask, in comparison with the first embodiment.

When a width Lt (see FIG. 1) of recessed portion HL is increased, the electric field is relaxed and a lifetime ($\Delta$TTF) is lengthened (see the following article). Therefore, from the perspective of lengthening the lifetime, greater width of recessed portion HL is preferable.

article: H. Fujii et al., "A Recessed Gate LDMOSFET for Alleviating HCI Effects", Proceedings of the 2016 28th ISPSD, Jun. 12-16, 2016, Prague, Czech Republic, pp. 167-170

Accordingly, in the present embodiment, width WA of each of the plurality of concave portions HLP is set to be greater than distance WB between adjacent concave portions HLP of the plurality of concave portions HLP. As a result, the sum of widths WA of the plurality of concave portions HLP can be ensured as large as possible and the lifetime is lengthened.

Figure 36:
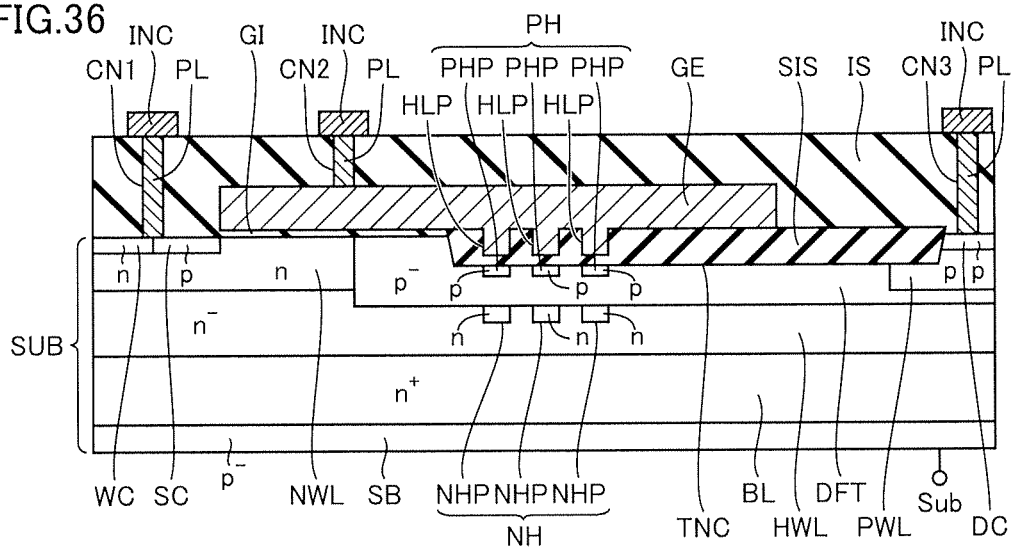
FIG. 36 is a cross-sectional view showing a configuration of a semiconductor device according to a modification of the third embodiment.

As shown in FIG. 36, p-type impurity region PH may be added to the configuration according to the third embodiment. P-type impurity region PH has a plurality of p-type region portions PHP. The plurality of p-type region portions PHP are arranged in regions located directly below the plurality of concave portions HLP, respectively.

Figure 37:
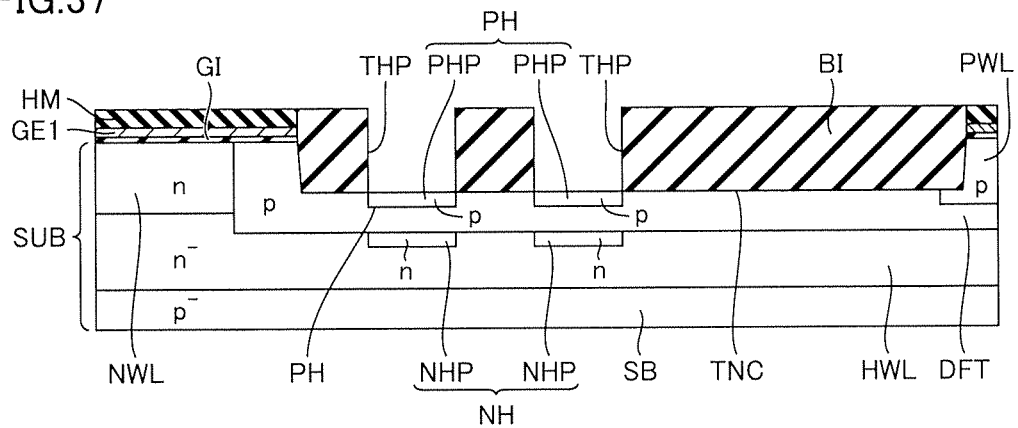
FIG. 37 is a cross-sectional view showing a method for manufacturing the semiconductor device shown in FIG. 36.

This modification is manufactured by injecting not only an n-type impurity but also a p-type impurity as shown in FIG. 37, instead of the manufacturing step in the third embodiment shown in FIG. 30. The manufacturing method according to the above-described modification other than described above is substantially the same as the manufacturing method according to the third embodiment, and thus, description thereof will not be repeated.

In this modification, p-type impurity region PH having the plurality of p-type region portions PHP is added, and thus, the function and effect similar to those in the second embodiment can be obtained.

Figure 38:
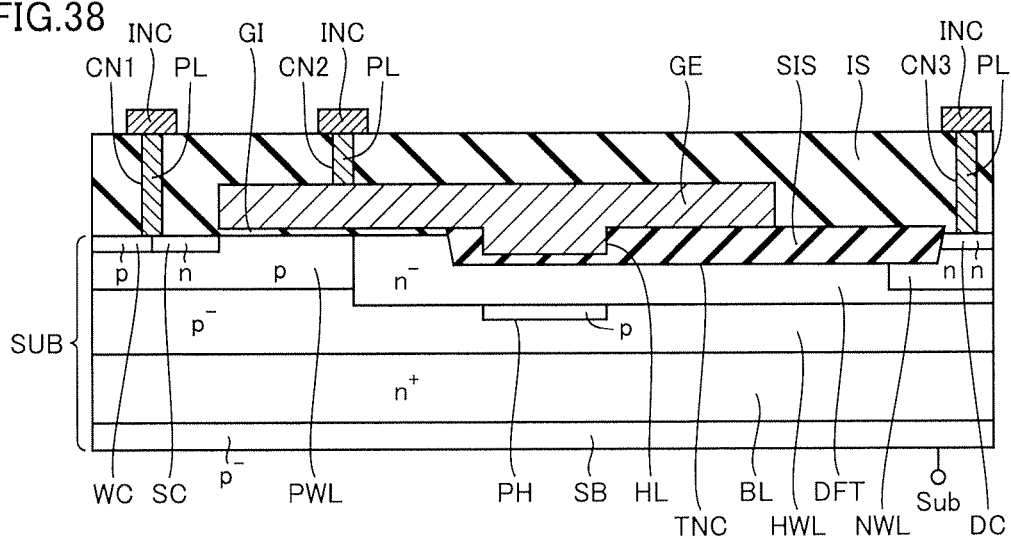
FIG. 38 is a cross-sectional view for explaining that the configuration according to the first embodiment is also applicable to an LDnMOS transistor.

Although the pLDMOS transistor has been described in the first to third embodiments, the present disclosure is also applicable to an nLDMOS transistor shown in FIG. 38. In this case as well, the function and effect similar to those described above can be obtained.

The pLDMOS transistor and the nLDMOS transistor have been described above. However, the present disclosure is also similarly applicable to a transistor such as a pLDMIS (Laterally Diffused Metal Insulator Semiconductor) transistor or an nLDMIS transistor, in which gate insulation film GI is made of a material other than the silicon oxide film.

Although the invention made by the present inventor has been specifically described above based on the embodiments, it goes without saying that the present invention is not limited to the above-described embodiments and can be variously changed without departing from the scope of the invention.

What is claimed is:
1. A semiconductor device comprising:
a semiconductor substrate having a main surface and an isolation trench formed in the main surface;
a source region of a first conductivity type arranged in the main surface of the semiconductor substrate;
a drain region of the first conductivity type arranged in the main surface so as to sandwich the isolation trench between the drain region and the source region;
a drift region of the first conductivity type located below the isolation trench and connected to the drain region;

an isolation insulation film filling the isolation trench and having a recessed portion in a top surface;
a gate electrode facing the main surface sandwiched between the source region and the drift region while being insulated from the main surface sandwiched between the source region and the drift region, and filling the recessed portion; and
a first impurity region of a second conductivity type having a portion located below the drift region and directly below the recessed portion, wherein the first impurity region is vertically aligned with a vertical side surface of the recessed portion and located only directly below the recessed portion.

2. The semiconductor device according to claim 1, wherein
a length of the isolation trench in a direction from the source region toward the drain region is denoted as Ld, and
the first impurity region is located within a dimensional range of one third of the length Ld from an end of the isolation trench on a source region side.

3. The semiconductor device according to claim 1, wherein
an end of the first impurity region on a drain region side is located closer to the source region than a position distanced from the recessed portion toward the drain region side by a dimension in a depth direction from a bottom portion of the recessed portion to a bottom portion of the isolation trench.

4. The semiconductor device according to claim 1, further comprising:
a first well region of the second conductivity type located below the drift region; and
a second well region of the second conductivity type located in the main surface between the source region and the drift region, wherein
the first well region has an impurity concentration lower than that of the second well region.

5. The semiconductor device according to claim 1, further comprising
a second impurity region of the first conductivity type located inside the drift region and directly below the recessed portion.

6. The semiconductor device according to claim 5, wherein
the second impurity region has a concentration peak lower than that of the first impurity region.

7. The semiconductor device according to claim 5, wherein
an end of the second impurity region on the drain region side is located closer to the source region than a position distanced from the recessed portion toward the drain region side by a dimension in a depth direction from a bottom portion of the recessed portion to a bottom portion of the isolation trench.

8. The semiconductor device according to claim 5, wherein
the recessed portion has a plurality of concave portions, and
the second impurity region has a plurality of second region portions located in regions directly below the plurality of concave portions, respectively.

9. The semiconductor device according to claim 1, wherein
the recessed portion has a plurality of concave portions, and
the first impurity region has a plurality of first region portions located in regions directly below the plurality of concave portions, respectively.

10. The semiconductor device according to claim 9, wherein
a width of each of the plurality of concave portions is greater than a distance between adjacent concave portions of the plurality of concave portions.

* * * * *